United States Patent
Choi et al.

(10) Patent No.: US 12,265,408 B2
(45) Date of Patent: Apr. 1, 2025

(54) APPARATUS FOR CONTROLLING IN-RUSH CURRENT AND AN OPERATION METHOD THEREOF

(71) Applicant: SK hynix Inc., Gyeonggi-do (KR)

(72) Inventors: Suk Hwan Choi, Gyeonggi-do (KR);
Chan Keun Kwon, Gyeonggi-do (KR);
Jin Yeop Kim, Gyeonggi-do (KR);
Chan Hui Jeong, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 187 days.

(21) Appl. No.: 17/966,075

(22) Filed: Oct. 14, 2022

(65) Prior Publication Data
US 2023/0403012 A1 Dec. 14, 2023

(30) Foreign Application Priority Data

Jun. 13, 2022 (KR) .......................... 10-2022-0071385

(51) Int. Cl.
G05F 1/46 (2006.01)
G05F 1/569 (2006.01)
G05F 3/30 (2006.01)

(52) U.S. Cl.
CPC .............. *G05F 1/468* (2013.01); *G05F 1/569* (2013.01); *G05F 1/465* (2013.01); *G05F 3/30* (2013.01)

(58) Field of Classification Search
CPC .......... G05F 1/465; G05F 1/468; G05F 1/569; G05F 3/30
See application file for complete search history.

(56) References Cited

U.S. PATENT DOCUMENTS

| | | | |
|---|---|---|---|
| 7,274,114 B1* | 9/2007 | Wong ........................ | G05F 1/56 307/72 |
| 8,089,353 B2 | 1/2012 | Tarng et al. | |
| 9,225,234 B2 | 12/2015 | Ku et al. | |
| 9,389,126 B2 | 7/2016 | Kim et al. | |
| 9,698,599 B2 | 7/2017 | Stratakos et al. | |
| 9,755,454 B1 | 9/2017 | Reynov et al. | |
| 2008/0239837 A1* | 10/2008 | Kumazaki .............. | G11C 5/145 365/189.09 |
| 2011/0260783 A1* | 10/2011 | Kawasaki ............... | G06F 1/324 327/540 |
| 2019/0355395 A1* | 11/2019 | Jeong ..................... | G11C 16/30 |

OTHER PUBLICATIONS

Bai Lian-Long et al., A read reference generator with negative temperature coefficient for 3D NAND flash memory, Microelectronics & Computer, Jul. 2019, pp. 12-16, vol. 36 No. 7, China.

* cited by examiner

Primary Examiner — Fred E Finch, III
(74) Attorney, Agent, or Firm — IP & T GROUP LLP

(57) ABSTRACT

A power circuit includes a plurality of regulators and a plurality of in-rush current controllers. The plurality of regulators is coupled to an external power voltage and configured to adjust a level of an input voltage to generate a plurality of internal power voltages. The plurality of in-rush current controllers is configured to provide the input voltage to the plurality of regulators, the input voltage corresponding to an increasement voltage. The increasement voltage has a level rising at a preset rate until the plurality of internal power voltages all reach a target level.

17 Claims, 12 Drawing Sheets

APPARATUS FOR CONTROLLING IN-RUSH CURRENT AND AN OPERATION METHOD THEREOF

CROSS-REFERENCE TO RELATED APPLICATIONS

This patent application claims the benefit to Korean Patent Application No. 10-2022-0071385, filed on Jun. 13, 2022, the entire disclosure of which is incorporated herein by reference.

TECHNICAL FIELD

Various embodiments of the present disclosure described herein relate to a semiconductor device and a method for controlling a semiconductor device.

BACKGROUND

A semiconductor device may include a plurality of capacitors that are disposed in various regions or areas of the device, in order to prevent a voltage drop from occurring across its power supply. When power is supplied to the semiconductor device, an in-rush current may exceed a rated load current during a time when one or more of the capacitors are being charged, (In-rush current may refer, for example, to a current that instantaneously flows for charging a capacitor within a semiconductor device when power is supplied), In some cases, the in-rush current might be generated when a capacitive load exists in the power system. The in-rush current might appear until the capacitor is charged to a specific amount.

In many cases, excessive in-rush current generation exceeds a maximum allowable current range for components, patterns, circuit boards, and the like, included in or coupled to the semiconductor device. The excessive in-rush current may damage the components, patterns, and/or circuit boards. Furthermore, when a power circuit in the semiconductor device fails to control the amount of in-rush current, a power voltage of a corresponding path may be lowered. When this occurs, power may not be sufficiently supplied to the corresponding region or area of the semiconductor device, which may adversely affect performance.

BRIEF DESCRIPTION OF THE DRAWINGS

The description herein makes reference to the accompanying drawings wherein like reference numerals refer to like parts throughout the figures.

DETAILED DESCRIPTION

Figure 1:
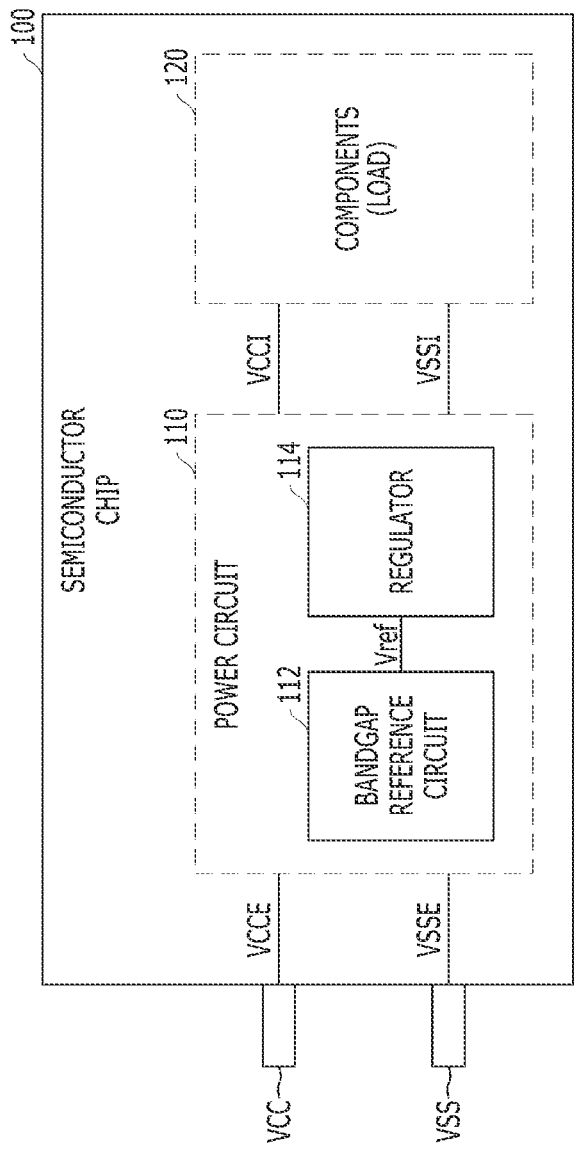
FIG. 1 illustrates an embodiment of a semiconductor device.

Various embodiments of the present disclosure are described below with reference to the accompanying drawings. Elements and features of the disclosure, however, may be configured or arranged differently to form other embodiments, which may be variations of any of the disclosed embodiments.

In this disclosure, references to various features (e.g., elements, structures, modules, components, steps, operations, characteristics, etc.) included in "one embodiment," "example embodiment," "an embodiment," "another embodiment," "some embodiments," "various embodiments," "other embodiments," "alternative embodiment," and the like are intended to mean that any such features are included in one or more embodiments of the present disclosure, but may or may not necessarily be combined in the same embodiments.

In this disclosure, the terms "comprise," "comprising," "include," and "including" are open-ended. As used in the appended claims, these terms specify the presence of the stated elements and do not preclude the presence or addition of one or more other dements. The terms in a claim do not foreclose the apparatus from including additional components (e.g., an interface unit, circuitry, etc.).

In this disclosure, various units, circuits, or other components may be described or claimed as "configured to" perform a task or tasks. In such contexts, "configured to" is used to connote structure by indicating that the blocks/units/circuits/components include structure (e.g., circuitry) that performs one or more tasks during operation. As such, the block/unit/arc/component can be said to be configured to perform the task even when the specified block/unit/circuit/component is not currently operational (e.g., is not turned on nor activated). The block/unit/circuit/component used with the "configured to" language includes hardware—for example, circuits, memory storing program instructions executable to implement the operation, etc. Additionally, "configured to" can include a generic structure (e.g., generic circuitry) that is manipulated by software and/or firmware (e.g., an FPGA or a general-purpose processor executing software) to operate in a manner that is capable of performing the task(s) at issue. "Configured to" may also include adapting a manufacturing process (e.g., a semiconductor fabrication facility) to fabricate devices (e.g., integrated circuits) that implement or perform one or more tasks.

As used herein, the terms "first," "second," "third," and so on are used as labels for nouns that the terms precede, and do not imply any type of ordering (e.g., spatial, temporal, logical, etc.). The terms "first" and "second" do not necessarily imply that the first value must be written before the second value. Further, although the terms may be used herein to identify various elements, these elements are not limited by these terms. These terms are used to distinguish one element from another element that otherwise have the same or sir similar names. For example, a first circuitry may be distinguished from a second circuitry.

Further, the term "based on" is used to describe one or more factors that affect a determination. This term does not foreclose additional factors that may affect a deter nation. That is, a determination may be solely based on those factors or based, at least in part, on those factors. For example, the phrase "determine A based on B." While in this case, B is a factor that affects the determination of A, such a phrase does not foreclose the determination of A from also being based on C. In other instances, A may be determined based solely on B.

According to an embodiment of the present disclosure, in response to a difference of timings when power voltages supplied by each of plural power circuits disposed at different positions of a semiconductor device reach a target level, it is possible to provide an apparatus and an operating method for controlling an in-rush current generated in the plural power circuits based on a power voltage that reaches the target level the latest among the power voltages.

In an embodiment of the present disclosure, a power circuit can include a plurality of regulators coupled to an external power voltage and configured to adjust a level of an input voltage to generate a plurality of internal power voltages; and a plurality of in-rush current controllers configured to provide the input voltage to the plurality of regulators, the input voltage corresponding to an increasement voltage, the increasement voltage having a level rising at a preset rate, until the plurality of internal power voltages all reach a target level.

The power circuit can further include a bandgap reference circuit configured to output a reference voltage having a constant level when the external power voltage is supplied. Each of the plurality of in-rush current controllers can be arranged between the bandgap reference circuit and the plurality of regulators and be configured to provide, as the input voltage, either the reference voltage at a second time period or the increasement voltage at a first time period to the plurality of regulators as the input voltage, the second time period after the first time period.

The plurality of regulators can be configured to: generate the plurality of internal power voltages at the first time period based on the increasement voltage until the plurality of internal power voltages reach the target level after the external power voltage is supplied; and generate the plurality of internal power voltages based on the reference voltage at the second time period after the plurality of internal power voltages reach the target level.

Each of the plurality of regulators can generate respective ones of the plurality of internal power voltages. The plurality of internal power voltages can reach at least two different target levels.

Timings when the plurality of internal power voltages generated by the plurality of regulators reach the target level can be different.

Each of the plurality of in-rush current controllers can include a comparator configured to compare the reference voltage with an internal power voltage output from a corresponding regulator among the plurality of regulators and to output a comparison result; and a multiplexer configured to select and output one of the reference voltage and the increasement voltage based on the comparison result.

The power circuit can further include at least one integrator configured to output the increasement voltage when a first time elapses after the external power voltage is supplied.

The power circuit can further include a combination logic configured to receive the comparison result output from the comparator included in each of the plurality of in-rush current controllers and output, to the at least one integrator, a timing when the plurality of internal power voltages reach the target level the latest.

The increasement voltage can have a same or lesser level than the reference voltage. A level of the increasement voltage can be increased during a second time, which is longer than the first time, according to a preset speed from a ground voltage to the constant level of the reference voltage.

In another embodiment, a semiconductor device can include a data device configured to store a data entry or process and modify the data entry; and a power circuit configured to supply a plurality of internal power voltages to the data device based on an external power voltage input through a pin or a pad. The power circuit can include a plurality of in-rush current controllers configured to provide an increasement voltage having a level rising at a preset rate, instead of a reference voltage having a constant level, until a timing when the plurality of internal power voltages reach a target level the latest.

The power circuit can further include a bandgap reference circuit configured to output the reference voltage having a constant level even when an operation condition changes; and a plurality of regulators coupled to an external power voltage and configured to adjust a level of the reference voltage or the increasement voltage to generate the plurality of internal power voltages.

The plurality of in-rush current controllers can be arranged between the bandgap reference circuit and the plurality of regulators.

The plurality of in-rush current controllers can provide a selected one of the reference voltage and the increasement voltage to the plurality of regulators based on different timings.

The plurality of regulators can be configured to: generate the plurality of internal power voltages based on the increasement voltage until the plurality of internal power voltages reach the target level after the external power voltage is supplied; and generate the plurality of internal power voltages based on the reference voltage after the plurality of internal power voltages reach the target level.

Each of the plurality of regulators can adjust a level of the reference voltage or the increasement voltage to generate each of the plurality of internal power voltages. The plurality of internal power voltages can reach at least two different target levels.

Timings when the plurality of internal power voltages generated by the plurality of regulators reach the target level can be different.

Each of the plurality of in-rush current controllers can include a comparator configured to compare the reference voltage with an internal power voltage output from a corresponding regulator among the plurality of regulators to output a comparison result; and a multiplexer configured to select and output one of the reference voltage and the increaser lent voltage based on the comparison result.

The power circuit can further include at least one integrator configured to output the increasement voltage when a first time elapses after the external power voltage is supplied.

The power circuit can further include a combination logic configured to receive the comparison result output from the comparator included in each of the plurality of in-rush current controllers and output, to the at least one integrator, a timing when the plurality of internal power voltages reach the target level the latest.

The increasement voltage can have a same or lesser level than the reference voltage. A level of the increasement voltage can be increased during a second time, which is longer than the first time, according to a preset speed from a ground voltage to the constant level of the reference voltage.

Another embodiment can provide an operation method of regulators that generate internal power voltages based on an external power voltage in a semiconductor device. The operation method can include generating a first reference voltage having a level rising at a preset rate in response to a power-on reset signal; generating a second reference voltage having a constant level; and providing, as a reference voltage, the regulators with the first reference voltage until a timing when the internal power voltages all reach target levels, and with the second reference voltage after the timing.

Embodiments of the present disclosure will now be described with reference to the accompanying drawings, wherein like numbers reference like elements.

FIG. 1 illustrates an embodiment of a semiconductor device including a chip 100 that includes electrical elements and circuits to perform a specific function. The semiconductor device chip 100 can include a plurality of pins or pads and can receive or output a power voltage, a data item, commands, or various types of control signals through the plurality of pins or pads. The circuits or electrical elements in the semiconductor device chip 100 may vary depending on a design purpose, and the number of pins or pads may also vary depending on the particular design.

In one embodiment, the semiconductor device chip 100 may include a memory device which includes a plurality of volatile memory cells or a plurality of non-volatile memory cells, a controller configured to control a data entry input to, or output from, the memory device or improve data input/output performance of the memory device, and/or a data processing unit such as an arithmetic device configured to process, calculate, or transform data entries. The semiconductor device chip 100 can be included in an electronic device implemented, for example, using a semiconductor substrate.

The pins or pads arranged in the semiconductor device chip 100 can be set and used according to a preset function or purpose. For example, when a specific pin or pad among the plurality of pins or pads is set to be used for data input/output, an electrical signal corresponding to the data entry (e.g., a waveform or a potential within a specific voltage range) is transmitted through the corresponding pin or pad. Further, when a power voltage is supplied via another specific pin or pad, this specific pin or pad may be used to receive a power voltage used for operation of internal components in the semiconductor device chip 100.

In an embodiment, a semiconductor device (such as a memory system or a processor) which satisfies a particular purpose may be developed to operate at a higher speed and consume less power. The semiconductor device chip 100 can include a plurality of circuits or modules to perform various functions. When a plurality of circuits, modules, or components that perform a plurality of functions are formed in different semiconductor device chips, delay and noise may occur in the process of transferring data and signals between circuits, modules, or components implemented in the different semiconductor device chips. As a result, operation performance of the memory system or the processor may be degraded. In an embodiment, the semiconductor device chip 100 may be designed to include various circuits, modules, or components, to thereby improve performance of the semiconductor device and increase the degree of integration of the semiconductor device.

According to an embodiment, the power circuit 110 can be applied to a non-volatile memory device or a memory system including the non-volatile memory device. Also, according to an embodiment, the pourer circuit 110 can be applied to a volatile memory device or a memory system including the volatile memory device. Meanwhile, the power circuit 110 can also be applied to a processor, a system IC, etc., designed for a specific purpose or function.

Because a plurality of circuits, modules, or components are included in the semiconductor device chip 100, changes in electrical loads inside the semiconductor device chip 100 may increase. For example, referring to FIG. 1, a power voltage VCC and a ground voltage VSS could be supplied through a plurality of pins or pads of the semiconductor device chip 100 to operate the plurality of circuits, modules, or components in the semiconductor device chip 100. In one example, the semiconductor device chip 100 can include the power circuit 110 that outputs an internal power voltage VCCI and an internal ground voltage VSSI, and a component 120 driven by the internal power voltage VCCI and the internal ground voltage VSSI. The power circuit 110 can generate the internal power voltage VCCI and the internal ground voltage VSSI based on an external power voltage VCCE and an external ground voltage VSSE supplied through at least one pin or pad.

The power circuit 110 can include a voltage regulator 114 and a reference voltage generator 112. The voltage regulator 114 can be used to supply stable power to an electronic device such as the component 120, The voltage regulator 114 can be classified into a linear regulator and a switching regulator. An example of the switching regulator can be a DC-DC converter. Although the DC-DC converter can have high conversion efficiency, the output voltage of the DC-DC converter may include a substantial amount of noise compared to that of the linear regulator.

An example of a linear regulator can be a low-dropout (LDO) regulator. In an embodiment, the LDO regulator may have low conversion efficiency. In another embodiment, the LDO regulator can have a fast response speed. In an embodiment, the output voltage of the LDO regulator can include a smaller amount of noise compared to that of the DC-DC converter. In an embodiment, the LDO regulator can be applicable to a noise-sensitive device or a device which may be driven with high performance. For example, in an embodiment the LDO regulator can compensate for the disadvantages of the DC-DC converter and can be applied to a memory system operating at high speed. The voltage regulator 114 can output the internal power voltage VCCI based on the external power voltage VCCE.

According to an embodiment, the component 120 described in FIG. 1 can include a memory device including a plurality of non-volatile memory cells. For example, the memory device including the plurality of non-volatile memory cells can include a plurality of memory blocks and a voltage supply circuit. According to an operation performed through the memory blocks and the voltage supply circuit, electrical loads of the component 120 may vary. Further, according to an embodiment, the component 120 can include at least one module or circuit included in a controller configured to control the memory device. When an overload or an overcurrent occurs due to the structure or operation of the component 120, a change of the internal power voltage VCCI or the internal ground voltage VSSI can occur.

According to an embodiment, the power circuit 110 can include a voltage sensor configured to detect a change of the internal power voltage VCCI or the internal ground voltage VSSI, Due to operation of the component 120, a phenomenon in which the internal ground voltage VCCI is changed or fluctuated at a specific position inside the semiconductor device chip 100 may occur. The power supplied into the component 120 may be determined based on a voltage difference between the internal ground voltage VSSI and the internal power voltage VCCI. However, when the internal ground voltage VSSI is not maintained at a level of 0V but fluctuates or changes in a range, for example, of −500 mV to 500 mV or more, the power supplied into the component 120 may exceed a preset range.

When the voltage regulator 114 generates the internal power voltage VCCI regardless of fluctuations of the internal ground voltage VSSI, a level of the internal power voltage VCCI (which is appropriately output from the voltage regulator 114) might not be supplied within the preset range to the component 120. For example, when the voltage regulator 114 outputs the internal power voltage VCCI of 5V based on the external ground voltage VSSE in the case where the internal ground voltage VSSI becomes 1V, the power supplied to the component 120 is a voltage of 4V as a result of the voltage difference between the internal power voltage VCCI and the internal ground voltage VSSI. In an embodiment, when a voltage of 4V is supplied into the component 120 of the semiconductor device chip 100, operation of the component 120 may become unstable.

According to an embodiment, the voltage regulator 114 may generate the internal power voltage VCCI in response to the internal ground voltage VSSI. For example, the voltage regulator 114 can output the internal power voltage VCCI based on a sum of a reference voltage Vref, which is independent from a change of the external power voltage VCCE, and the internal ground voltage VSSI, which fluctuates or changes environmentally by the component 120. An environmental change may include, for example, changes or variations in the process, voltage, and/or temperature (e.g., Process-Voltage-Temperature (PVT) variations) in the semiconductor device chip 100. For example, the voltage regulator 114 may include an adder circuit capable of summing the reference voltage Vref and the internal ground voltage VSSI. In a process of outputting the internal power voltage VCCI based ort the sum of the reference voltage Vref and the internal ground voltage VSSI, the voltage regulator 114 can track a change of the internal ground voltage VSSI and stably supply the internal power voltage VCCI into the component 120.

Referring to FIG. 1, so that the voltage regulator 114 outputs a stable internal power voltage VCCI even when a change in PVT occurs, the power circuit 110 can include a reference voltage generator (or a bandgap reference circuit) 112. For example, in an embodiment, the bandgap reference circuit 112 can output the reference voltage Vref having a stable or constant level even though a change in PVT occurs, and the regulator 114 can output the internal power voltage VCCI based on the reference voltage Vref output from the bandgap reference circuit 112.

In some embodiments, the power supply circuit 110 may include capacitors disposed throughout the semiconductor device so that there is no voltage drop in the power supply. When external power sources VCC and VSS are supplied to the semiconductor device chip 100, an in-rush current may exceed a rated load current while charging the capacitors, Excessive in-rush current may exceed a maximum allowable current range for components and patterns in the semiconductor device chip 100. In this case, the components and patterns in the semiconductor device chip 100 may be damaged. In addition, when the power circuit 110 in the semiconductor device chip 100 fails to control the amount of in-rush current, a power voltage of the corresponding path may be lowered. As a result, sufficient power might not be supplied to the component 120. To offset these effects, the power circuit 110 can include a circuit for controlling the in-rush current.

Figure 2:
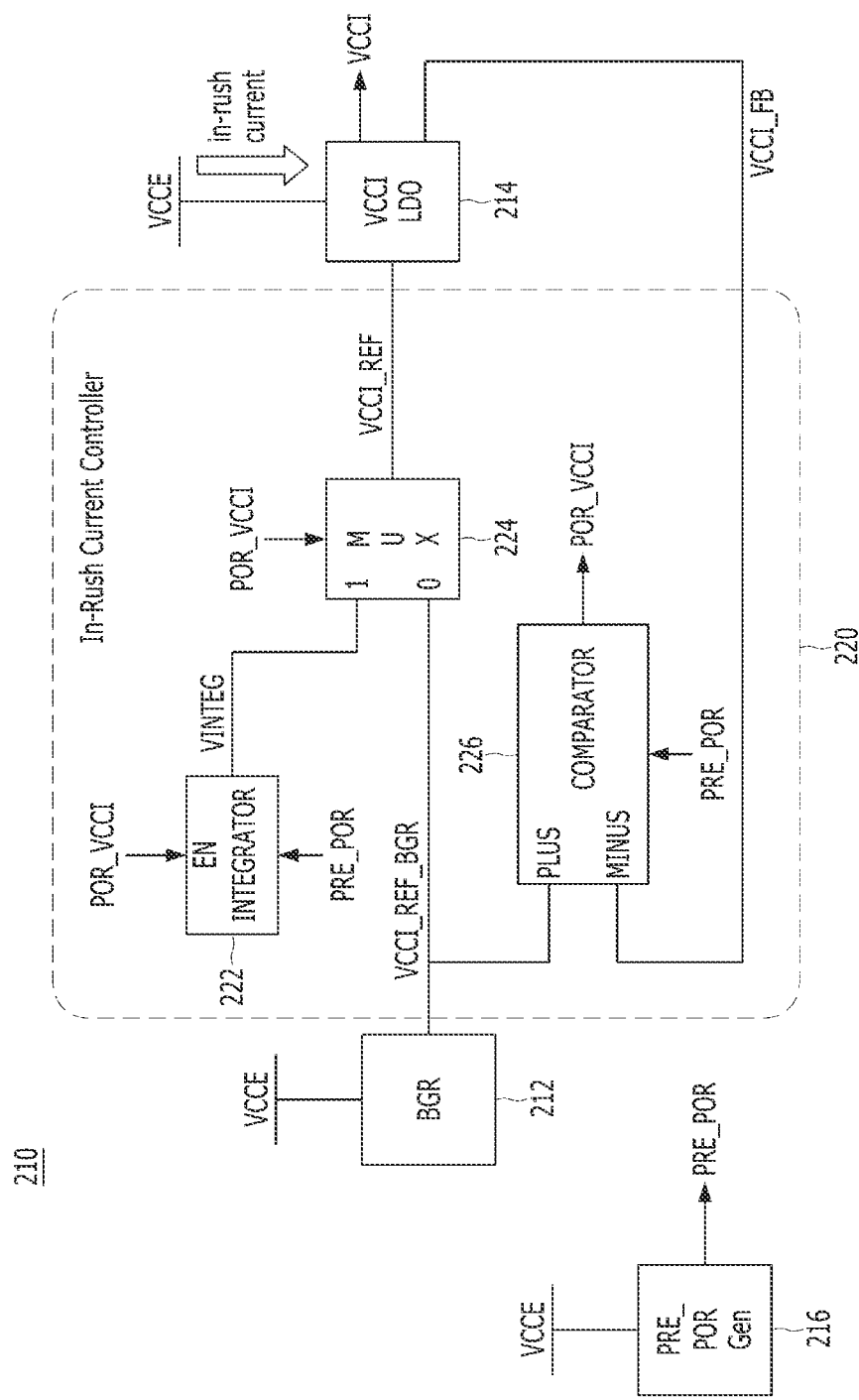
FIG. 2 illustrates an embodiment of a power circuit.
Figure 3:
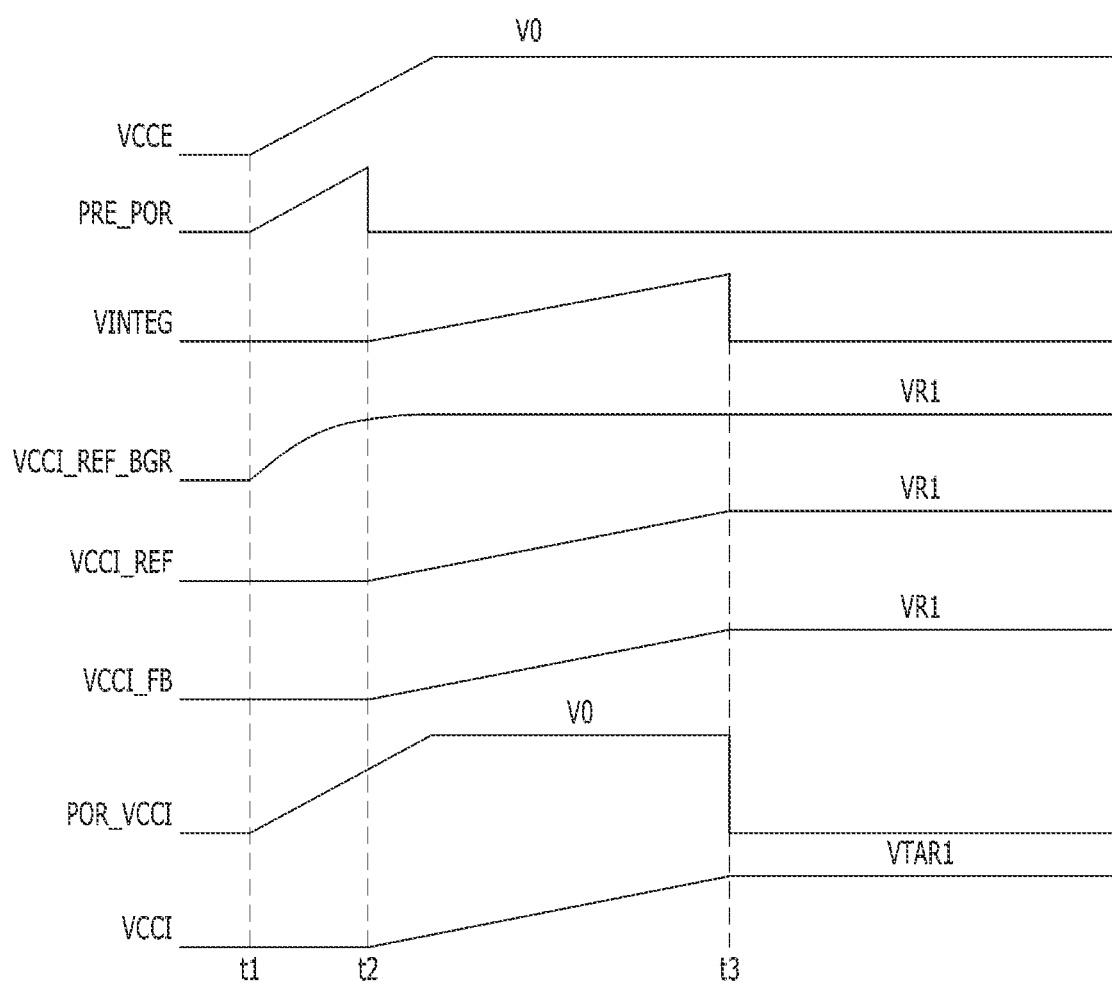
FIG. 3 illustrates an example of a timing diagram corresponding to operation of the power circuit shown in FIG. 2.

FIG. 2 illustrates a power circuit according to an embodiment of the present disclosure. FIG. 3 illustrates an example of a timing diagram for controlling operation of the power circuit shown in FIG. 2.

Referring to FIGS. 2 and 3, a power circuit 210 can include a bandgap reference circuit (BGR) 212, a voltage regulator (VCCI LDD) 214, an internal power output controller (PRE-POR Gen) 216, and an in-rush current controller 220, The in-rush current controller 220 can include an integrator 222, a multiplexer (MUX) 224, and a comparator 226. The bandgap reference circuit 212 and the voltage regulator 214 in the power circuit 210 described in FIG. 2 can correspond to the reference voltage generator (or bandgap reference circuit) 112 and the voltage regulator 114 in the power circuit 110 described in FIG. 1, The power circuit 210 can further include the in-rush current controller 220 coupled between the bandgap reference circuit 212 and the voltage regulator 214.

The internal power output controller 216 in the power circuit 210 can output a power output enable signal (or a power-on reset signal) PRE_POR when the external power voltage VCCE is supplied. The power output enable signal PRE_POR can enable the power circuit 210 to generate and output the internal power voltage VCCI at a second timing t2, i.e., a power-on reset (POR), when a predetermined time passes after the external power voltage VCCE is supplied at a first timing t1. If the internal power voltage VCCI is output without any limitation after the external power voltage VCCE is supplied, the internal power voltage VCCI can vary according to the change of the external power voltage VCCE. A fluctuating internal power voltage VCCI could damage the circuits, modules, devices, etc., in the component 120.

To overcome this issue, the power output enable signal PRE_POR can limit the power circuit 210 from outputting the internal power voltage VCCI until the external power voltage VCCE reaches a preset level. For example, the power output enable signal PRE_POR output from the internal power output controller 216 can be input to the integrator 222 and the comparator 226 in the in-rush current controller 220.

The integrator 222 can generate an increasement voltage VINTEG based on a comparison result POR_VCCI output from the comparator 226 and the power output enable signal PRE_POR. The integrator 222 can gradually increase a voltage level of the increasement voltage VINTEG according to a preset rising rate. When the internal power voltage VCCI is generated in response to the increasement voltage VINTEG output from the integrator 222, the voltage level of the internal power voltage VCCI can also increase in response to the preset rising rate set in the integrator 222.

After the external power voltage VCCE is supplied, it is possible to prevent a sudden increase in the voltage level of the internal power voltage VCCI. For example, the integrator 222 may start to increase the voltage level of the increasement voltage VINTEG in response to the power output enable signal PRE_POR at the second timing t2, In response to the comparison result POR_VCCI output from the comparator 226, the voltage level of the increasement voltage VINTEG might no longer be increased at a third timing t3.

The comparator 226 can compare the bandgap reference voltage VCCI_REF_BGR output from the bandgap reference circuit 212 with a feedback internal power voltage VCCI_FB, which is the same as the internal power voltage VCCI output from the voltage regulator 214, to output the comparison result POR_VCCI. The comparator 226 may output the comparison result POR_VCCI in response to the power output enable signal PRE_POR output from the internal power output controller 216. For example, immediately after the external power voltage VCCE is supplied, the level of the external power voltage VCCE may increase, and the level of the bandgap reference voltage VCCI_REF_BGR output from the bandgap reference circuit 212 may not be constant. At this time, the comparison result POR_VCCI output by the comparator 226 may not be accurate. Accordingly, in response to the power output enable signal PRE_POR, the comparator 226 can output the comparison result POR_VCCI at the second timing t2 when a predetermined time elapses after the external power voltage VCCE is supplied at the first timing t1.

Referring to FIG. 3, when the external power voltage VCCE starts to be supplied at the first timing t1, the level of the external power voltage VCCE may rise from 0V to a first level V0, and then the external power voltage VCCE having the first level V0 may be supplied. The internal power output controller 216 can output the power output enable signal PRE_POR (having a voltage level which increases according to an increase in the level of the external power voltage VCCE) until the second timing t2 when the preset time has elapsed after the external power voltage VCCE is started to be supplied at the first timing t1. According to the power output enable signal PRE_POR, the integrator 222 can output the increasement voltage VINTEG after the second timing t2. Also, due to the power output enable signal PRE_POR, the comparator 226 might not output the comparison result POR_VCCI until the second timing t2.

The comparison result POR_VCCI output from the comparator 226 is input to the multiplexer 224. The multiplexer 224 can select and output one of the increasement voltage VINTEG output from the integrator 222 and a bandgap reference voltage VCCI_REF_BGR output from the bandgap reference circuit 212 as a reference internal voltage VCCI_REF. According to an embodiment, the voltage regulator 214 can be configured to receive the reference internal voltage VCCI_REF output from the multiplexer 224 in the in-rush current controller 220, and to generate an internal supply voltage VCCI by adjusting a voltage level of the reference internal voltage VCCI_REF by a preset multiple (e.g., 1×, 1.2×, 1.5×, 2×, etc.).

According to an embodiment, the level of the feedback internal power voltage VCCI_FB transmitted from the voltage regulator 214 to the in-rush current controller 220 can be determined by adjusting the preset multiple for generating the internal power voltage VCCI, For example, in a case when the voltage regulator 214 generates the internal power voltage VCCI having a level that is twice the voltage level of the reference internal voltage VCCI_REF, the feedback internal power voltage VCCI_FB can be adjusted to have a voltage level ½ times that of the internal power voltage VCCI.

The reference internal voltage VCCI_REF input to the voltage regulator 214 is either the increasement voltage VINTEG (whose level is gradually increased at a preset rate) or a bandgap reference voltage VCCI_REF_BGR having a constant level despite a change in the operating environment. Accordingly, because the voltage regulator 214 generates the internal power voltage VCCI based on one of the increasement voltage VINTEG and the bandgap reference voltage VCCI_REF_BGR, the amount of the in-rush current occurring after the external power voltage VCCE could be reduced or suppressed.

Referring to FIG. 3, when the external power voltage VCCE is supplied at the first timing t1, the bandgap reference voltage VCCI_REF_BGR output from the bandgap reference circuit 212 can rise from 0V to a stable or constant level VR1 and be maintained afterwards. However, the level of the internal power voltage VCCI can start to rise from the second timing t2 in response to the power output enable signal PRE_POR. According to an embodiment, the comparator 226 can output the comparison result POR_VCCI corresponding to the voltage level of the external power voltage VCCE without performing a comparison operation until the second timing t2. At the second timing t2, the level of the bandgap reference voltage VCCI_REF_BGR output from the bandgap reference circuit 212 could be greater than the level of the feedback internal power voltage VCCI_FB, so that the comparator 226 can output the comparison result POR_VCCI corresponding to the level of external power voltage VCCE. At the third timing t3 when the internal power voltage VCCI rises to a preset level, the comparison result POR_VCCI of the comparator 226 is inverted. After the third timing t3, the level of the bandgap reference voltage VCCI_REF_BGR is equal to that of the feedback internal power voltage VCCI_FB, so that the comparison result POR_VCCI could be 0V. In response to the comparison result POR_VCCI, the integrator 222 can stop outputting the increasement voltage VINTEG.

Referring to FIGS. 2 and 3, after the external power voltage VCCE is supplied, the power circuit 210 can control the internal power voltage VCCI until the level of the internal power voltage VCCI rises to a preset level. When the power circuit 210 gradually increases the level of the internal power voltage VCCI, the in-rush current could be reduced or suppressed. However, as the component 120 in the semiconductor device chip 100 described with reference to FIG. 1 becomes more complex and diversified, the power circuit 110 may generate a plurality of internal power voltages VCCI and may therefore include a plurality of voltage regulators. The plurality of voltage regulators could be disposed in a predetermined dispersed manner or may be arranged at various positions of the semiconductor device chip 100, Further, according to embodiments, levels of the plurality of internal power voltages could be different.

Figure 4:
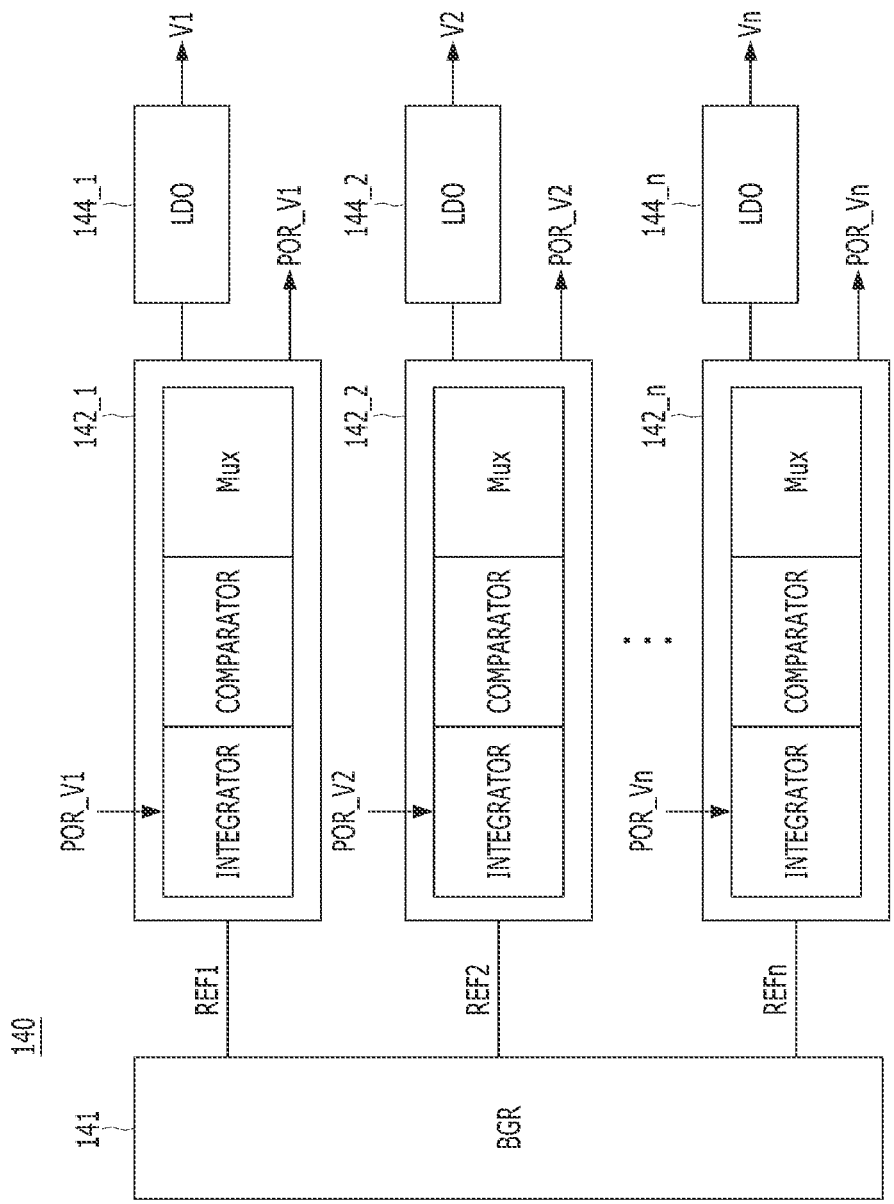
FIG. 4 illustrates an embodiment of a power circuit.

FIG. 4 illustrates an embodiment of a power circuit 140 that can include a plurality of voltage regulators (LDD) 144_1, 144_2, . . . , 144_n. The voltage regulators 144_1, 144_2, . . . , 144_n can individually output internal power voltages V1, V2, . . . , Vn. The power circuit 140 can include a plurality of in-rush current controllers 142_1, 142_2, . . . , 142_n disposed or arranged between bandgap reference circuits (BGR) 141, 142 outputting a plurality of reference voltages REF1, REF2, . . . , REFn, and the plurality of voltage regulators 144_1, 144_2, . . . , 144_n.

Each of the in-rush current controllers 142_1, 142_2, . . . , 142_n can include an integrator, a comparator, and a multiplexer. The comparison results POR_V1, POR_V2, . . . , POR_Vn are output from the comparators in each of the in-rush current controllers 142_1, 142_2, . . . , 142_n and then are input to the integrator in each of the plurality of in-rush current controllers 142_1, 142_2, . . . , 142_n. Operations of the integrator, the comparator, and the multiplexer could be understood, for example, with reference to FIGS. 2 and 3.

The power circuit 140 described in FIG. 4 can include the in-rush current controllers 142_1, 142_2, . . . , 142_n corresponding to the voltage regulators 144_1, 144_2, ..., 144_n for outputting the internal power voltages V1, V2, ..., Vn, so that in-rush currents could be reduced or suppressed until the internal power voltages V1, V2, ..., Vn reach a preset target level. The time it takes for each of the internal power voltages V1, V2, ..., Vn generated by the voltage regulators 144_1, 144_2, ..., 144_n to reach a preset target level after the external power voltage is supplied could be different. However, the in-rush current controllers 142_1, 142_2, ..., 142_n corresponding to the voltage regulators 144_1, 144_2, ..., 144_n can suppress an amount of in-rush current based on comparison results POR_V1, POR_V2, ..., POR_Vn regarding the respective internal power voltages V1, V2, ..., Vn, Even though the times may be different, the following cases may be avoided: an in-rush current that causes damage to an internal component and/or the case where the level of the internal power voltage does not reach to a preset target level.

Figure 5:
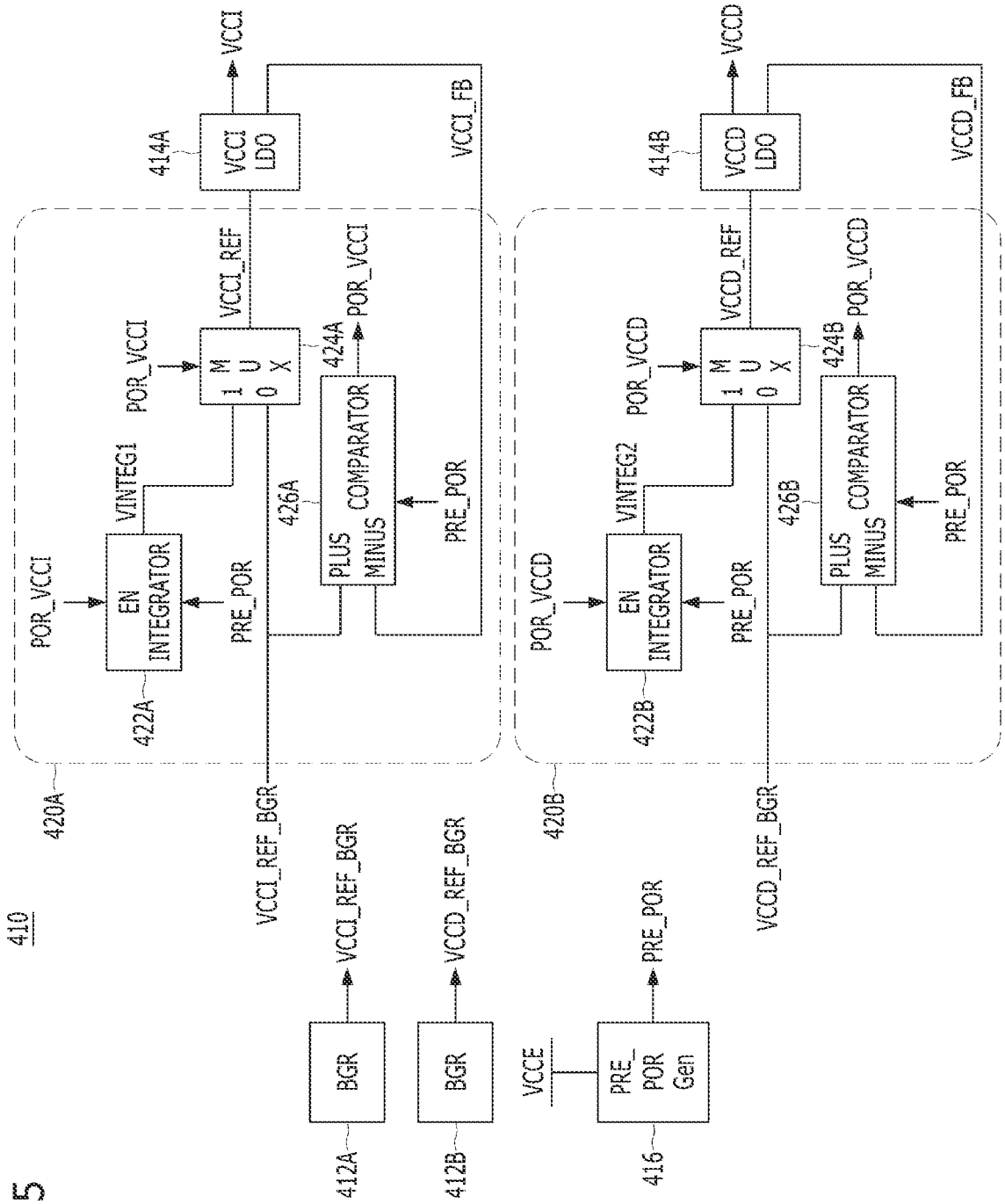
FIG. 5 illustrates an embodiment of a power circuit.
Figure 6:
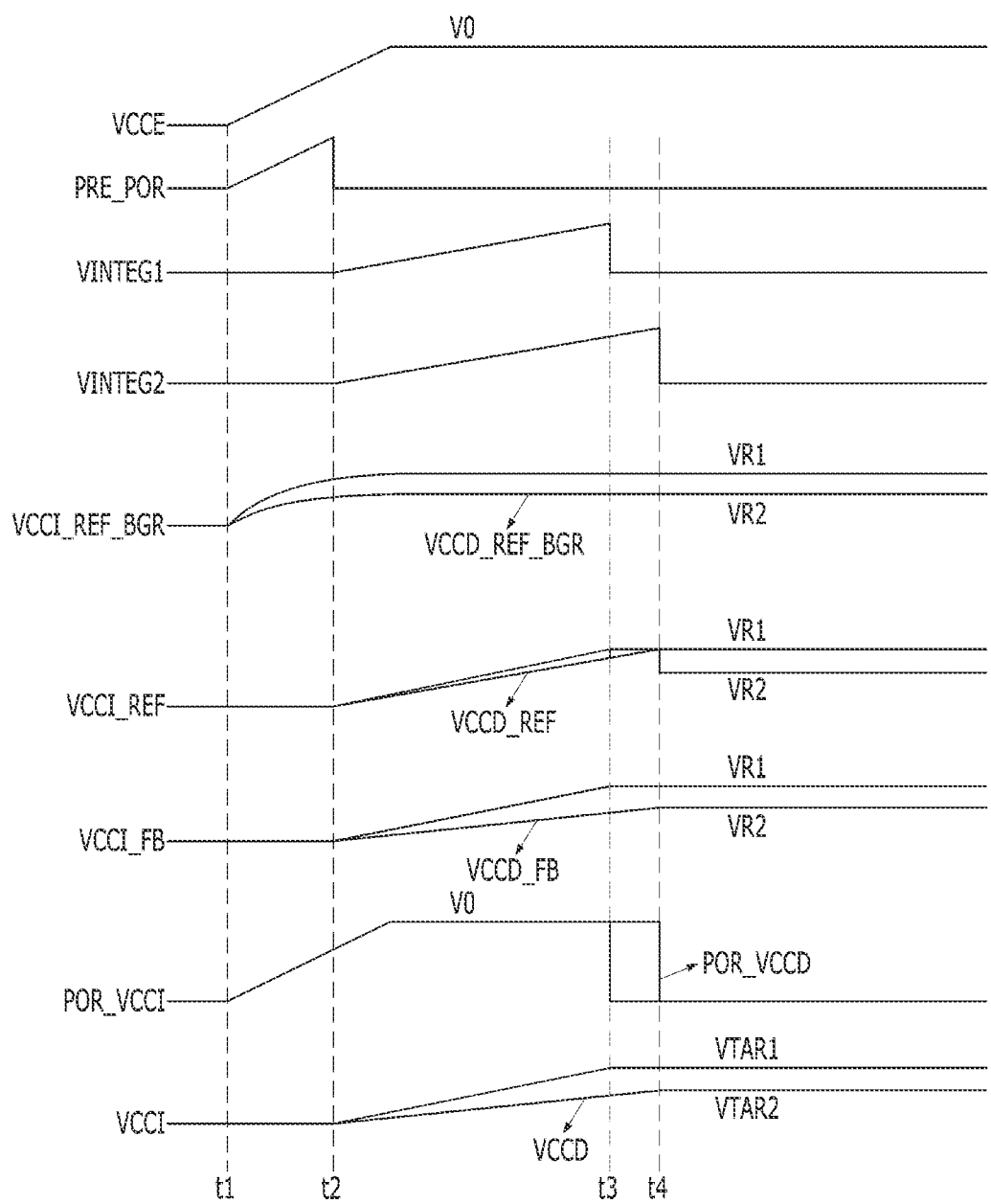
FIG. 6 illustrates an example of a timing diagram corresponding to operation of the power circuit shown in FIG. 5.

FIG. 5 illustrates an embodiment of a power circuit, and FIG. 6 illustrates an example of a timing diagram for controlling operation of the power circuit shown in FIG. 5.

Referring to FIGS. 5 and 6, the power circuit 410 can include a plurality of bandgap reference circuits (BGR) 412A, 412B, a plurality of voltage regulators (VCCI LDD, VCCD LDD) 414A, 414B, an internal power output controller (PRE-POR Gen) 416, and a plurality of in-rush currents, controllers 420A, 420B. The voltage regulators 414A, 414B can output a plurality of internal power voltages VCCI, VCCD. Each of the in-rush current controllers 420A, 420B can include an integrator 422A, 422B, a multiplexer (MUX) 424A, 424B, and a comparator 426A, 426B, The bandgap reference circuits 412A, 412B and the voltage regulators 414A, 414B in the power circuit 410 described in FIG. 5 can correspond to the bandgap reference circuits 112 and the voltage regulator 114 in the power circuit 110 described in FIG. 1, The power circuit 410 can further include the in-rush current controllers 420A, 420B coupled between the bandgap reference circuits 412A, 412B and the voltage regulators 414A, 414B.

The internal power output controller 416 in the power circuit 410 can output a power output enable signal PRE_POR when the external power voltage VCCE is supplied. The power output enable signal PRE_POR can enable the power circuit 410 to generate the internal power voltages VCCI, VCCD at a second timing t2 when a predetermined time elapses after the external power voltage VCCE is supplied at a first timing t1. If a plurality of internal power voltages VCCI, VCCD are output without any limitation after the external power voltage VCCE is supplied, the internal power voltages VCCI, VCCD may fluctuate according to a change of the external power voltage VCCE. The fluctuations in the internal power voltage could damage circuits, modules, devices, etc., in the component 120. To overcome this issue, the power output enable signal PRE_POR can restrict the power circuit 410 to generate the internal power voltages VCCI, VCCD until the level of the external power voltage VCCE reaches a preset level. For example, the power output enable signal PRE_POR output from the internal power output controller 416 may be input to the integrators 422A, 422B and the comparators 426A, 426B included in each of the in-rush current controllers 420A, 420B.

The first integrator 422A in the first in-rush current controller 420A can generate a first increasement voltage VINTEG1 based on a first comparison result POR_VCCI output from the first comparator 426A and the power output enable signal PRE_POR. The first integrator 422A can gradually increase the level of the first increasement voltage VINTEG1 according to a preset rising rate. When the first internal power voltage VCCI is generated in response to the first increasement voltage VINTEG1 output from the first integrator 422A, the level of the first internal power voltage VCCI can increase in a manner that corresponds to the preset rising rate set in the first integrator 422A. As a result, after the external power voltage VCCE is supplied, the level of the first internal power voltage VCCI can be prevented from rapidly increasing. For example, the first integrator 422A may start to increase the level of the first increasement voltage VINTEG1 in response to the power output enable signal PRE_POR from the second timing t2, but the level of the first increasement voltage VINTEG1 might no longer be increased in response to the comparison result POR_VCCI output from the second comparator 426A at the third timing t3.

The operation of the second integrator 422E in the second in-rush current controller 426E could be substantially the same as that of the first integrator 422k For example, the second integrator 422B can generate a second increasement voltage VINTEG2 based on a second comparison result POR_VCCD output from the second comparator 425E and the power output enable signal PRE_POR.

The first comparator 426A in the first in-rush current controller 420A can compare a first bandgap reference voltage VCCI_REF_BGR output from the first bandgap reference circuit 412A with a first internal power supply voltage VCCI output from the first voltage regulator 414A to output a first comparison result POR_VCCI. The first comparator 426A can output the first comparison result POR_VCCI in response to the power output enable signal PRE_POR output from the internal power output controller 216, For example, immediately after the external power voltage VCCE is supplied, the level of the external power voltage VCCE is increasing, and the first bandgap reference voltage VCCI_REF_BGR output from the first bandgap reference circuit 412A might not be constant. At this point in time, it may be difficult to the first comparison result POR_VCCI output from the first comparator 426A may not be accurate. Accordingly, the first comparator 426A can output the first comparison result POR_VCCI in response to the power output enable signal PRE_POR, from the second timing t2 when a predetermined time has elapsed after the external power voltage VCCE is supplied at the first timing t1.

The second comparator 426B in the second in-rush current controller 420B can operate substantially the same as the first comparator 426A in the first in-rush current controller 420A. The second comparator 426B can output a second comparison result POR_VCCD by comparing a second bandgap reference voltage VCCD_REF_BGR output from the second bandgap reference circuit 412B with a second feedback internal power voltages VCCD_FB corresponding to a second internal power voltage VCCD output from the second voltage regulator 414B.

Referring to FIG. 6, after the external power voltage VCCE starts to be supplied at the first timing t1, the level of the external power voltage VCCE can rise from 0V to a first level V0. Then, the external power voltage VCCE of the first level V0 can be supplied to the power circuit 410. The internal power output controller 216 can output a power output enable signal PRE_POR having an increasing level in response to the increased level of the external power voltage VCCE, until the second timing t2 when the preset time has elapsed from the first timing t1 when the external power voltage VCCE is supplied, Based on the power output enable signal PRE_POR, the first and second integrators 422A, 422B can output the first and second increasement voltages VINTEG1, VINTEG2 after the second timing t2. Further, the first and second comparators 426A, 426B might not output the first and second comparison results POR_VCCI, POR_VCCD according to the power output enable signal PRE_POR until the second timing t2.

The first and second comparison results POR_VCCI, POR_VCCD output from the first and second comparators 426A, 426B are input to the first and second multiplexers 424A, 424B. The first and second multiplexers 424A, 424B can select and output one of the first and second increasement voltages VINTEG1, VINTEG2 output from the first and second integrators 422A and 422B and the first and second bandgap reference voltages VCCI_REF_BGR, VCCD_REF_BGR output from the first and second bandgap reference circuits 412A and 412B, as first and second reference internal voltages VCCI_REF, VCCD_REF. This operation may be performed in response to the first and second comparison results POR_VCCI, POR_VCCD. The first and second voltage regulators 414A, 414B can receive the first and second reference internal voltages output from the first and second multiplexers 424A, 424B in the first and second in-rush current controllers 420A, 420B, and adjust the level of the first and second reference internal voltages VCCD_REF, VCCD_REF by a preset multiple (e.g., 1×, 1.2×, 1.5×, 2×, etc.) in order to generate the first and second internal power voltages VCCI, VCCD each having a corresponding target level.

According to an embodiment, the first and second feedback internal power voltages VCCI_FB, VCCD_FB can be transferred from the first and second voltage regulators 414A, 414B to the first and second in-rush current controllers 420A, 420B. The first and second feedback internal power voltages VCCI_FB, VCCD_FB can be determined by adjusting levels of the first and second internal power voltages VCCI, VCCD by a preset multiple. For example, when the first voltage regulator 414A generates the first internal power voltage VCCI having a level that is one times the level of the first reference internal voltage VCCI_REF, the level of the first feedback internal power voltage VCCI_FB could be one times the level of the first internal power voltage VCCI. When the second voltage regulator 414B generates the second internal power voltage VCCD having a level that is twice the level of the second reference internal voltage VCCD_REF, the level of the second feedback internal power voltage VCCD_FB can be ½ times the level of the internal power voltage VCCD.

The first and second reference internal voltages VCCI_REF, VCCD_REF input to the first and second voltage regulators 414A, 414B can be determined as one of the first and second increasement voltages VINTEG1, VINTEG2 whose levels are gradually increased at a preset rate and the first and second bandgap reference voltages VCCI_REF_BGR, VCCD_REF_BGR that have a constant level despite the change in the operating environment. Accordingly, because the first and second voltage regulators 414A, 414B operate to generate the first and second internal power voltages VCCI, VCCD based on the first and second increasement voltages VINTEG1, VINTEG2 and the first and second bandgap reference voltages VCCI_REF_BGR, VCCD_REF_BGR, the amount of the in-rush current occurring after the external power voltage VCCE is supplied could be reduced or suppressed.

Referring to FIG. 6, after the external power voltage VCCE is supplied at the first timing t1, the first bandgap reference voltage VCCI_REF_BGR output from the first bandgap reference circuit 412A can increase from 0V to a stable level of VR1, and then the stable level VR1 of the first bandgap reference voltage VCCI_REF_BGR could be maintained after the first bandgap reference voltage VCCI_REF_BGR reaches to the stable level VR1. Further, the level of the second bandgap reference voltage VCCD_REF_BGR output from the second bandgap reference circuit 412B could be maintained after rising from 0V to a stable level VR2. However, the levels of the first and second internal power voltages VCCI, VCCD start to rise at the second timing t2 based on the power output enable signal PRE_POR. According to an embodiment, the first and second comparators 426A, 426B may not perform a comparison operation until the second timing t2, and the first and second comparison results POR_VCCI, POR_VCCD could be output corresponding to the level of the external power voltage VCCE until the second timing t2.

At the second timing t2, the levels of the first and second bandgap reference voltages VCCI_REF_BGR, VCCD_REF_BGR output from the first and second bandgap reference circuits 412A, 412B can be greater than the levels of the first and second feedback internal power voltages VCCI_FB, VCCD_FB. The first and second comparators 426A, 426B can individually output the first and second comparison results POR_VCCI, POR_VCCD corresponding to the level of the external power voltage VCCE.

At a third timing t3 when the first internal power voltage VCCI reaches a preset level, the first comparison result POR_VCCI output from the first comparator 426A can be inverted. At the third timing t3, the level of the first bandgap reference voltage VCCI_REF_BGR can be equal to that of the first feedback internal power voltage VCCI_FB, so that the first comparison result POR_VCCI becomes 0V. In response to the first comparison result POR_VCCI, the first integrator 422A can stop outputting the first increasement voltage VINTEG1.

At a fourth timing t4 when the second internal power voltage VCCD reaches a preset level, the second comparison result POR_VCCD output from the second comparator 426B can be inverted. At the fourth timing t4, the level of the second bandgap reference voltage VCCD_REF_BGR can be equal to that of the second feedback internal power voltage VCCD_FB, so that the second comparison result POR_VCCD becomes 0V. In response to the second comparison result POR_VCCD, the second integrator 422B can stop outputting the second increasement voltage VINTEG2. Before the fourth timing t4, the second integrator 422B can output the second increasement voltage VINTEG2 in response to the second comparison result POR_VCCD, and the second increasement voltage VINTEG2 can be output as a second reference internal voltage VCCD_REF. After the fourth timing t4, the second bandgap reference voltage VCCD_REF_BGR having the preset level VR2 can be output as the second reference internal voltage VCCD_REF corresponding to the second comparison result POR_VCCD.

The third timing t3 when the first internal power voltage VCCI output from the first voltage regulator 414A reaches a preset level can be different from the fourth timing t4 when the second internal power voltage VCCD output from the second voltage regulator 414B reaches a preset level. This may occur because preset target levels of the first internal power voltage VCCI and the second internal power voltage VCCD output from the power circuit 410 are different from each other. Further, a time difference between the third timing t3 and the fourth timing t4 may occur due to the change (e.g., a PVT change) in a design, manufacture, and/or operating environment regarding the bandgap reference circuits 412A, 412B, the voltage regulators 414A, 414B, and the in-rush current controllers 420A, 420B in the power circuit 140. This time difference can be recognized based on a difference between the first comparison result POR_VCCI and the second comparison result POR_VCCD output from the first comparator 426A and the second comparator 426B.

The first integrator 422A and the second integrator 422B can output the first increasement voltage VINTEG1 and the second increasement voltage VINTEG2 based on the first comparison result POR_VCCI and the second comparison result POR_VCCD output from the first and second comparators 426A, 426B in each of the first in-rush current controller 420A and the second in-rush current controller 420B. Accordingly, the first internal power voltage VCCI and the second internal power voltage VCCD can gradually increase to a preset voltage level, so that the in-rush current could be reduced or suppressed in this duration.

Figure 7:
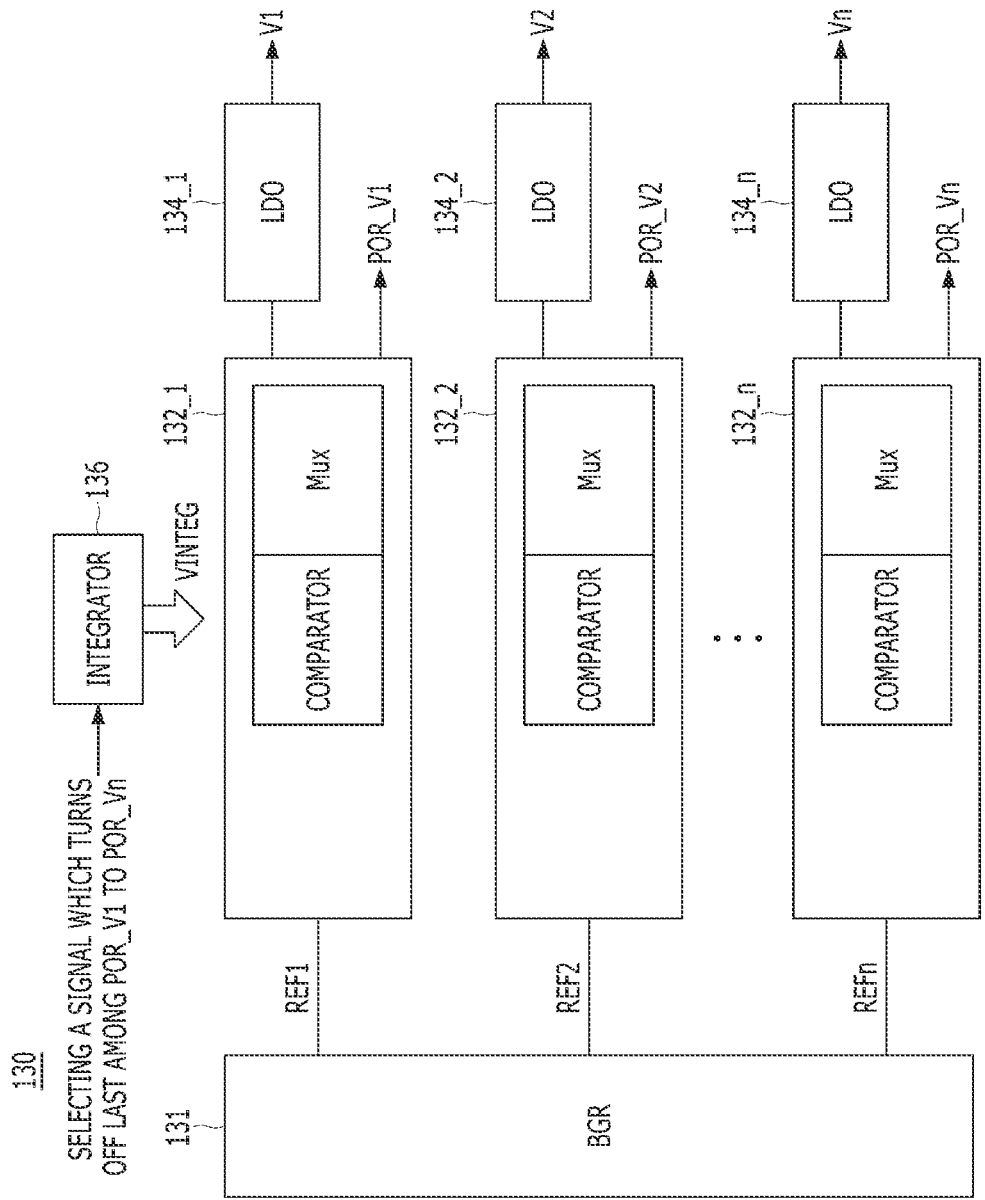
FIG. 7 illustrates an embodiment of a power circuit.

FIG. 7 illustrates an embodiment of the power circuit 130, which cart include a plurality of voltage regulators 134_1, 134_2, ..., 134_n. The voltage regulators 134 ... 134_2, ..., 134_n can output internal power voltages V1, V2, ..., Vn, respectively. The power circuit 130 can include a bandgap reference circuit 131 that outputs a plurality of reference voltages REF1, REF2, ..., REFn and a plurality of in-rush current controllers 132_1, 132_2, ..., 132_n disposed between the bandgap reference circuit 131 and the voltage regulators 134_1, 134_2, ..., 134_n.

Each of the in-rush current controllers 132_1, 132_2, ..., 132_n can include a comparator and a multiplexer. The comparison results POR_V1, POR_V2, ..., POR_Vn output from the comparators in each of the in-rush current controllers 132_1, 132_2, ..., 132_n may be input to the integrator 136. Unlike the power circuit 140 described with reference to FIG. 4, each of the in-rush current controllers 132_1, 132_2, ..., 132_n in the power circuit 130 does not include an integrator. The power circuit 130 can include a single integrator 136. The increasement voltage VINTEG generated by the integrator 136 can be input to the in-rush current controllers 132_1, 132_2, ..., 132_n.

In addition, a signal that is turned off the latest among the plurality of comparison results POR_V1, POR_V2, ..., POR_Vn from the in-rush current controllers 132_1, 132_2, ..., 132_n can be input to the integrator 136. For example, when the second comparison result POR_V2 is turned off the latest among the plurality of comparison results POR_V1, POR_V2, ..., POR_Vn, the second comparison result POR_V2 can be input to the integrator 136. For example, when one of the comparison results POR_V1, POR_V2, ..., POR_Vn is turned off the latest, it can indicate that an internal power voltage associated with the corresponding comparison result reaches a target level the latest. Operations of the integrator 136 and the comparators and multiplexers in the in-rush current controllers 132_1, 132_2, ..., 132_n can be understood, for example, with reference to FIGS. 2 and 3.

The power circuit 130 described in FIG. 7 can include a plurality of in-rush current controllers 132_1, 132_2, ..., 132_n corresponding to the plurality of voltage regulators 134_1, 134_2, ..., 134_n, which are configured to output the plurality of internet power voltages V1, V2, ..., Vn so that an amount of in-rush current could be suppressed until the plurality of internal power voltages V1, V2, ..., Vn generated by the plurality of voltage regulators 134_1, 134_2, ..., 134_n all reach a preset voltage level after the external power voltage is supplied. However, the preset voltage level may be reached at different times. That is, there may be a difference of tunings when each of the internal power voltages V1, V2, ..., Vn reaches a target level.

However, the in-rush current controllers 132_1, 132_2, ..., 132_n, corresponding to the voltage regulators 134_1, 134_2, ..., 134_n can suppress the amount of in-rush current based on an internal power voltage which reaches the target level the latest among the plurality of internal power voltages V1, V2, ..., Vn. Which one reaches the target level the latest among the internal power voltages V1, V2, ..., Vn can be recognized through the comparison results POR_V1, POR_V2, ..., POR_Vn. Accordingly, even though there is time difference when each of the internal power voltages V1, V2, ..., Vn reaches a target level, the in-rush current could be reduced or suppressed in response to an internal power voltage that reaches a target level the latest among the internal power voltages V1, V2, ..., Vn. As a result, damage to the internal components could be avoided. Further, the case where the level of the internal power voltage does not reach a preset target level can be avoided.

Figure 8:
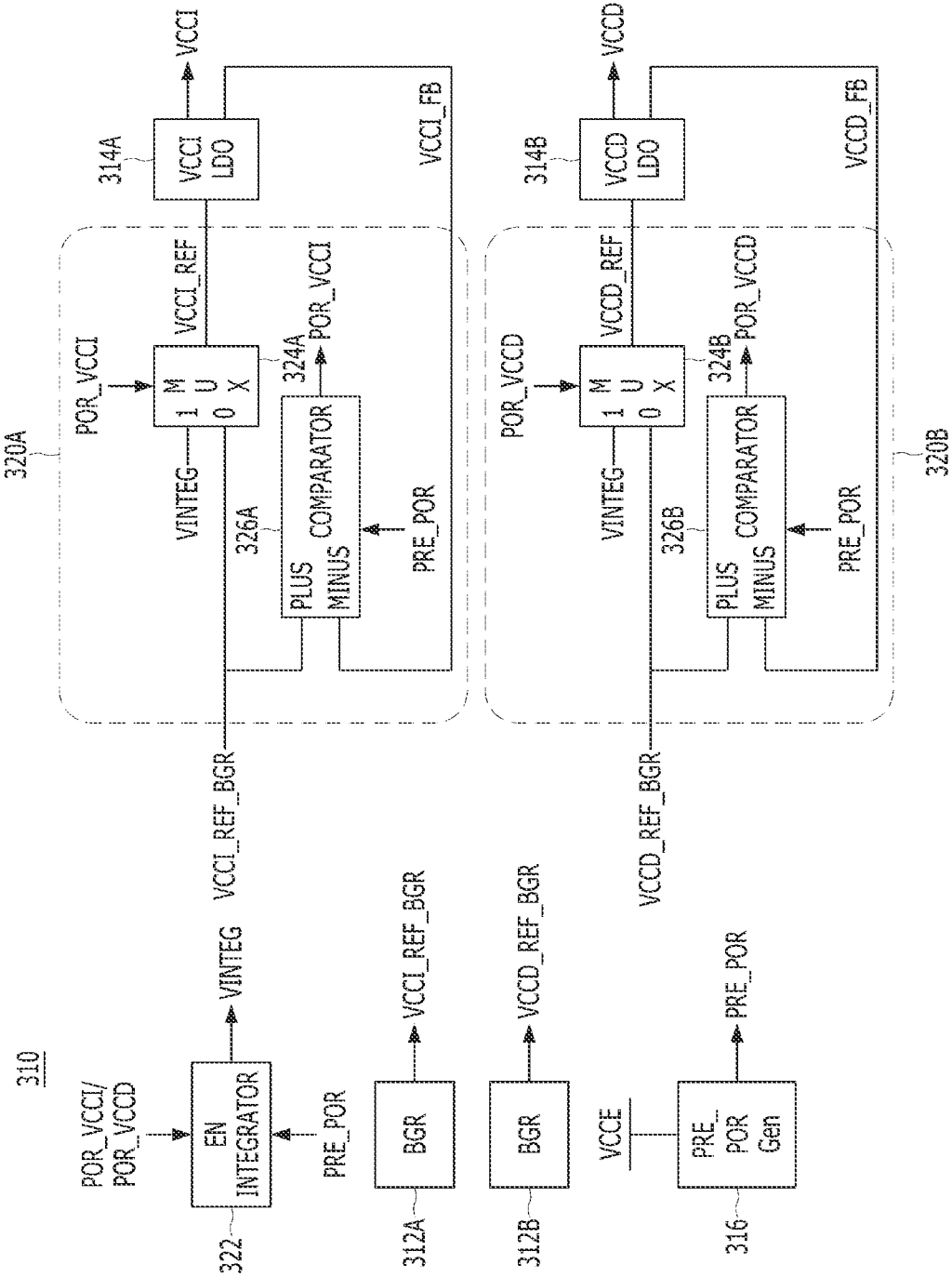
FIG. 8 illustrates an embodiment of a power circuit.
Figure 9:
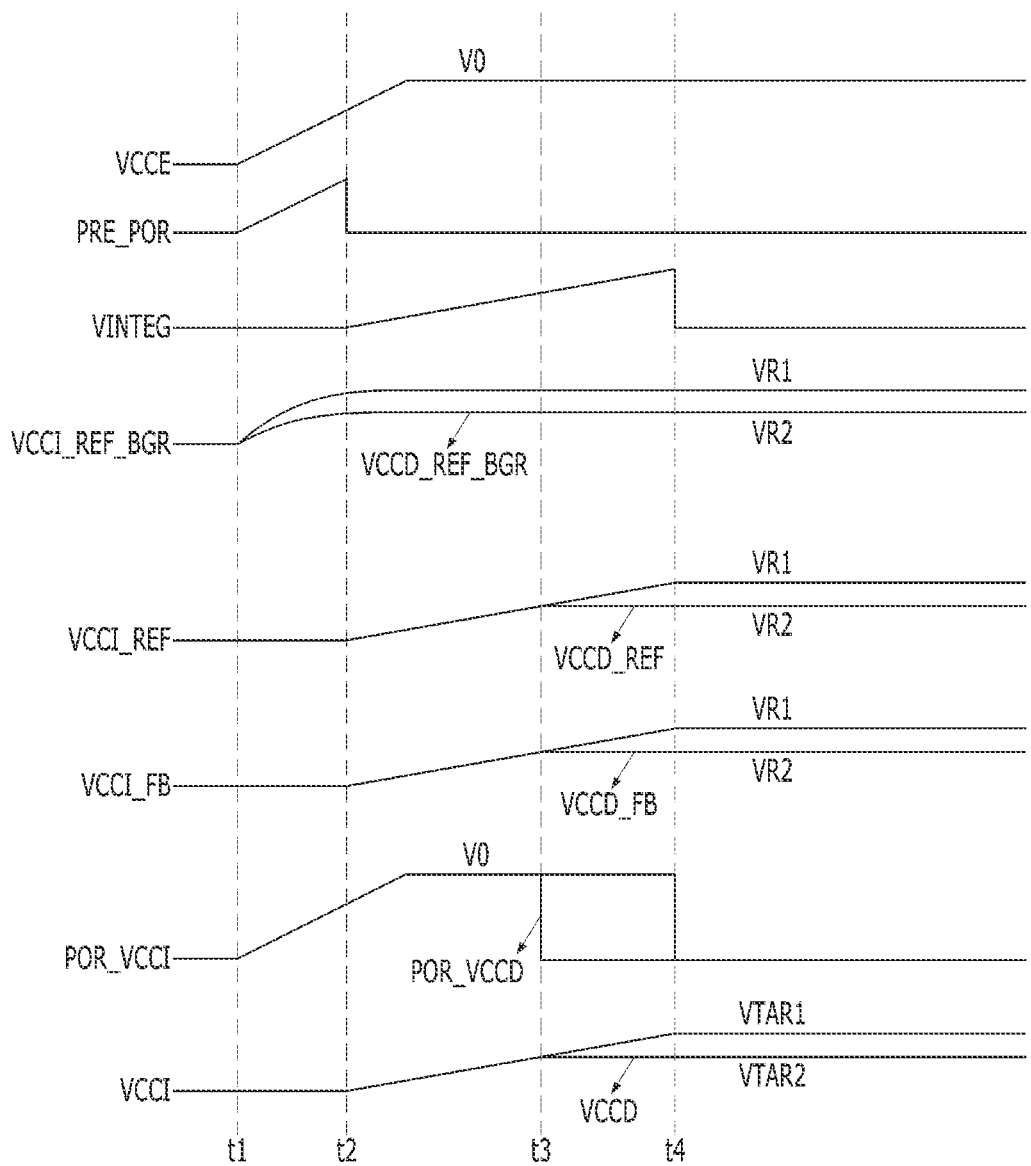
FIG. 9 illustrates an example of a timing diagram corresponding to operation of the power circuit shown in FIG. 8.

FIG. 8 illustrates an embodiment of a power circuit, and FIG. 9 illustrates an example of a timing diagram describing operation of the power circuit shown in FIG. 8.

Referring to FIGS. 8 and 9, a power supply circuit 310 can include a plurality of bandgap reference circuits (BCR) 312A, 312B, a plurality of voltage regulators (VCCI LDD, VCCD LDD) 314A, 314B, an internal power output controller (PRE_POR Gen) 316, and a plurality of in-rush current controllers 320A, 320B, The voltage regulators 314A, 314B can output a plurality of internal power voltages VCCI, VCCD. Each of the in-rush current controllers 320A, 320E can include a multiplexer (MUX) 424A, 424B and a comparator 426A, 426B. The power circuit 310 may include an integrator 322 capable of providing an increasement voltage VINTEG to the in-rush current controllers 320A, 320B. The bandgap reference circuits 312A, 312B and the voltage regulators 314A, 314B in the power circuit 310 described in FIG. 8 can correspond, for example, to the bandgap reference circuit 112 and the voltage regulator 114 in the power circuit 110 described in FIG. 1, The power circuit 310 can further include the in-rush current controllers 320A, 320B arranged between the bandgap reference circuits 312A, 312B and the voltage regulators 314A, 314B.

The internal power output controller 316 in the power circuit 310 can output a power output enable signal PRE_POR when the external poi power voltage VCCE is supplied. The power output enable signal PRE_POR can enable the power circuit 310 to output the internal power voltages VCCI, VCCD at a second timing t2 when a predetermined time passes after the external power voltage VCCE is supplied at a first timing t1. If the internal power voltages VCCI, VCCD are output without any limitation immediately after the external power voltage VCCE is supplied, the internal power voltages VCCI, VCCD may fluctuate according to changes of the external power voltage VCCE. Fluctuating internal power voltages can, in turn, cause damage to circuits, modules, devices, etc., in the component 120 described with reference to FIG. 1.

In order to overcome this issue, the power output enable signal PRE_POR can restrict the power circuit 310 to generate the internal power voltages VCCI, VCCD until the level of the external power voltage VCCE reaches a preset level. For example, the power output enable signal PRE_POR output from the internal power output controller 316 can be input to the comparators 326A, 326B and the integrator 322 in each of the in-rush current controllers 320A, 320B.

The integrator 322 in the power circuit 310 can output the increasement voltage VINTEG based on the power output enable signal PRE_POR and either the first comparison result POR_VCCI output from the first comparator 426A or the second comparison result POR_VCCD output from the second comparator 426B. A comparison result that is turned off later among the first comparison result POR_VCCI output from the first comparator 326A and the second comparison result POR_VCCD output from the second comparator 326B can be input to the integrator 322.

Referring to FIG. 9, the second comparison result POR_VCCD can be turned off at a third timing t3, and the first comparison result POR_VCCI can be turned off at a fourth timing t4 later than the third timing t3. In this case, the first comparison result POR_VCCI, not the second comparison result POR_VCCD, can be input to the integrator 322 until the fourth timing t4, so that the integrator 322 can output the increasement voltage VINTEG until the fourth timing t4.

The integrator 322 can gradually increase the level of the increasement voltage VINTEG according to a preset rising rate. When the first internal power voltage VCCI or the second internal power voltage VCCD is generated in response to the increasement voltage VINTEG output from the integrator 322, the level of the first internal power voltage VCCI or the second internal power voltage VCCD could be changed corresponding to the preset rising rate set for the integrator 322. Accordingly, the case where the level of the first internal power voltage VCCI or the second internal power voltage VCCD increases rapidly after the external power voltage VCCE is supplied can be avoided. For example, the integrator 322 can start to increase the level of the increasement voltage VINTEG in response to the power output enable signal PRE_POR from the second timing t2. Then, the level of the increasement voltage VINTEG can no longer be increased at the fourth timing t4, in response to the first comparison result POR_VCCI output from the first comparator 326A.

The first comparator 326A in the first in-rush current controller 320A can compare a first bandgap reference voltage VCCI_REF_BGR (having a preset voltage level VR1 output from the first bandgap reference circuit 312A) with a first feedback internal power voltage VCCI_FB (which is the same as the first internal power voltage VCCI output from the first voltage regulator 314A) to generate the first comparison result POR_VCCI. The first comparator 326A can output the first comparison result POR_VCCI in response to the power output enable signal PRE_POR output from the internal power output controller 316.

For example, the level of the external power voltage VCCE could be increasing immediately after the external power voltage VCCE is supplied, and the first bandgap reference voltage VCCI_REF_BGR output from the first bandgap reference circuit 312A might not be constant. At this time, the first comparison result POR_VCCI output by the first comparator 326A may not be accurate. Accordingly, the first comparator 326A can output the first comparison result POR_VCCI, in response to the power output enable signal PRE_POR, when a predetermined time elapses after the external power voltage VCCE is supplied at the first timing t1. Referring to FIG. 9, the first comparator 326A outputs the first comparison result POR_VCCI having a voltage level V0 corresponding to the level of the external power voltage VCCE until the fourth timing t4, From the fourth timing t4 when the first internal power voltage VCCI reaches a target level VTAR1, the first comparison result POR_VCCI of 0 V can be output.

The second comparator 326B in the second in-rush current controller 320B may operate substantially the same as the first comparator 326A in the first in-rush current controller 320A. The second comparator 326B can compare a second bandgap reference voltage VCCD_REF_BGR (having a preset level VR2 output from the second bandgap reference circuit 312B) with a second feedback internal power voltage VCCD_FB (having the same level as the second internal power voltage VCCD output from the second voltage regulator 314B) to generate the second comparison result POR_VCCD. Referring to FIG. 9, until the third timing t3, the second comparator 326B can output the second comparison result POR_VCCD having a voltage level VU corresponding to the level of the external power voltage VCCE. Then, the second comparison result POR_VCCD of UV can be output after the third timing t3 when the second internal power voltage VCCD reaches a target voltage level VTAR2.

Referring to FIG. 9, when the external power voltage VCCE starts to be supplied at the first timing t1, the level of the external power voltage VCCE can increase from 0V to a first level V0, and then the level of the external power voltage VCCE can be maintained as the first level VU. The internal power output controller 316 can output the power output enable signal PRE_POR having a level increased in response to the increase in the level of the external power voltage VCCE from the first timing t1 when the external power voltage VCCE is supplied until the second timing t2 when a preset time has elapsed after the first timing t1. Based on the power output enable signal PRE_POR, the integrator 322 can output the increasement voltage VINTEG after the second timing t2. Further, according to the power output enable signal PRE_POR, the first and second comparators 326A, 326B might not output the first and second comparison results POR_VCCI, POR_VCCD until the second timing t2.

The first and second comparison results POR_VCCI, POR_VCCD output from the first and second comparators 326A, 326B are input to first and second multiplexers 324A, 324B, The first and second multiplexers 324A, 324B can select and output one of the increasement voltage VINTEG (output from the integrator 322 in response to the first and second comparison results POR_VCCI, POR_VCCD) and the first and second bandgap reference voltages VCCI_REF_BGR, VCCD_REF_BGR output from the first and second bandgap reference circuits 312A, 312B as first and second reference internal voltages VCCI_REF, VCCD_REF. The first and second voltage regulators 314A, 314B can receive the first and second reference internal voltages VCCI_REF, VCCD_REF output from the first and second multiplexers 324A, 324B in the first and second in-rush current controllers 320A, 320B, and generate the first and second internal power voltages VCCI, VCCD having a level corresponding to a preset multiple (e.g., 1×, 1.2×, 1.5×, 2×, etc.) of the level of the first and second reference internal voltages VCCI_REF, VCCD_REF.

According to an embodiment, the first and second feedback internal power voltages VCCI_FB, VCCD_FB transferred from the first and second voltage regulators 314A, 314B to the first and second in-rush current controllers 320A, 320B can be determined by adjusting the level of the first and second internal power voltages VCCI, VCCD based on the preset multiple used for generating the first and second internal power voltages VCCI, VCCD. For example, when the first voltage regulator 414A generates the first internal power voltage VCCI having a level that is one times the level of the first reference internal voltage VCCI_REF, the level of the first feedback internal power voltage VCCI_FB could be one times the level of the first internal power voltage VCCI. When the second voltage regulator 414B generates the second internal power voltage VCCD having a level that is twice the level of the second reference internal voltage VCCD_REF, the level of the second feedback internal power voltage VCCD_FB can be ½ times the level of the internal power voltage VCCD.

The first and second reference internal voltages VCCI_REF, VCCD_REF input to the first and second voltage regulators 314A, 314B can be determined as one of the first and second increasement voltages VINTEG1, VINTEG2 whose levels are gradually increased at a preset rate and the first and second bandgap reference voltages VCCI_REF_BGR, VCCD_REF_BGR that have a constant level despite changes in the operating environment. Accordingly, because the first and second voltage regulators 314A, 314B operate to generate the first and second internal power voltages VCCI, VCCD based on the first and second increasement voltages VINTEG1, VINTEG2 and the first and second bandgap reference voltages VCCI_REF_BGR, VCCD_REF_BGR, the amount of the in-rush current that may occur after the external power voltage VCCE is supplied could be reduced or suppressed.

Referring to FIG. 9, when the external power voltage VCCE is supplied at the first timing t1, the first bandgap reference voltage VCCI_REF_BGR output from the first bandgap reference circuit 312A can increase from 0V to a stable level of VR1. Then, the stable level VR1 of the first bandgap reference voltage VCCI_REF_BGR could be maintained after the first bandgap reference voltage VCCI_REF_BGR reaches to the stable level VR1. Further, the level of the second bandgap reference voltage VCCD_REF_BGR output frog the second bandgap reference circuit 312B may be maintained after rising from 0V to a stable level VR2. However, the levels of the first and second internal power voltages VCCI, VCCD start to rise at the second timing t2 based on the power output enable signal PRE_POR. According to an embodiment, the first and second comparators 326A, 326B do not perform the comparison operation unto the second timing t2, and the first and second comparison results POR_VCCI, POR_VCCD could be output corresponding to the level of the external power voltage VCCE until the second timing t2. At the second timing t2, the levels of the first and second bandgap reference voltages VCCI_REF_BGR, VCCD_REF_BGR output from the first and second bandgap reference circuits 312A, 312B can be greater than the levels of the first and second feedback internal power voltages VCCI_FB, VCCD_FB. The first and second comparators 326A, 326B can individually output the first and second comparison results POR_VCCI, POR_VCCD corresponding to the level of the external power voltage VCCE.

At the third timing t3 when the second internal power voltage VCCD reaches a preset level, the second comparison result POR_VCCD output from the second comparator 326B can be inverted. At the third timing t3, the level of the second bandgap reference voltage VCCD_REF_BGR could equal to that of the second feedback internal power voltage VCCD_FB, so that the second comparison result POR_VCCD become 0V, Although the second comparison result POR_VCCD is inverted at the third timing t3, the integrator 322 can still output the increase lent voltage VINTEG in response to the first comparison result POR_VCCI. After the third tinning t3, the second voltage regulator 314B can generate a second internal power voltage VCCD based on the second bandgap reference voltage VCCD_REF_BGR output from the second bandgap reference circuit 312B. However, because the first comparison result POR_VCCI is not turned off until the fourth timing t4, the first voltage regulator 314A can generate the first internal power voltage VCCI based on the increasement voltage VINTEG output from the integrator 322.

At the fourth timing t4 when the first internal power voltage VCCI reaches a preset level, the first comparison result POR_VCCI output from the first comparator 326A can be inverted. At the fourth timing t4, the level of the first bandgap reference voltage VCCI_REF_BGR is equal to that of the first feedback internal power voltage VCCI_FB, so that the first comparison result POR_VCCI becomes 0V. In response to the first comparison result POR_VCCI, the integrator 322 can stop outputting the increasement voltage VINTEG, Until the fourth timing t4, the integrator 322 can output the increasement voltage VINTEG in response to the first comparison result POR_VCCI, and the increasement voltage VINTEG can be output as a first reference internal voltage VCCI_REF. After the fourth timing t4, the first bandgap reference voltage VCCI_REF_BGR having a preset level VR1 can be output as the first reference internal voltage VCCI_REF based on the first comparison result POR_VCCI.

The fourth timing t4 when the first internal power voltage VCCI output from the first voltage regulator 314A reaches a preset level can be different from the third timing t3 when the second internal power voltage VCCD output from the second voltage regulator 314B reaches a preset level. This may be because preset target levels of the first internal power voltage VCCI and the second internal power voltage VCCD output from the power circuit 310 are different from each other. Further, the time difference between the third timing t3 and the fourth timing t4 may occur due to the change (e.g., a PVT change) in design, manufacture, and/or operating environment regarding the bandgap reference circuits 312A, 312B, the voltage regulators 314A, 314B, and the in-rush current controllers 320A, 320B in the power circuit 140. This time difference can be recognized through the first comparison result POR_VCCI and the second comparison result POR_VCCD output from the first comparator 326A and the second comparator 326B.

Figure 10:
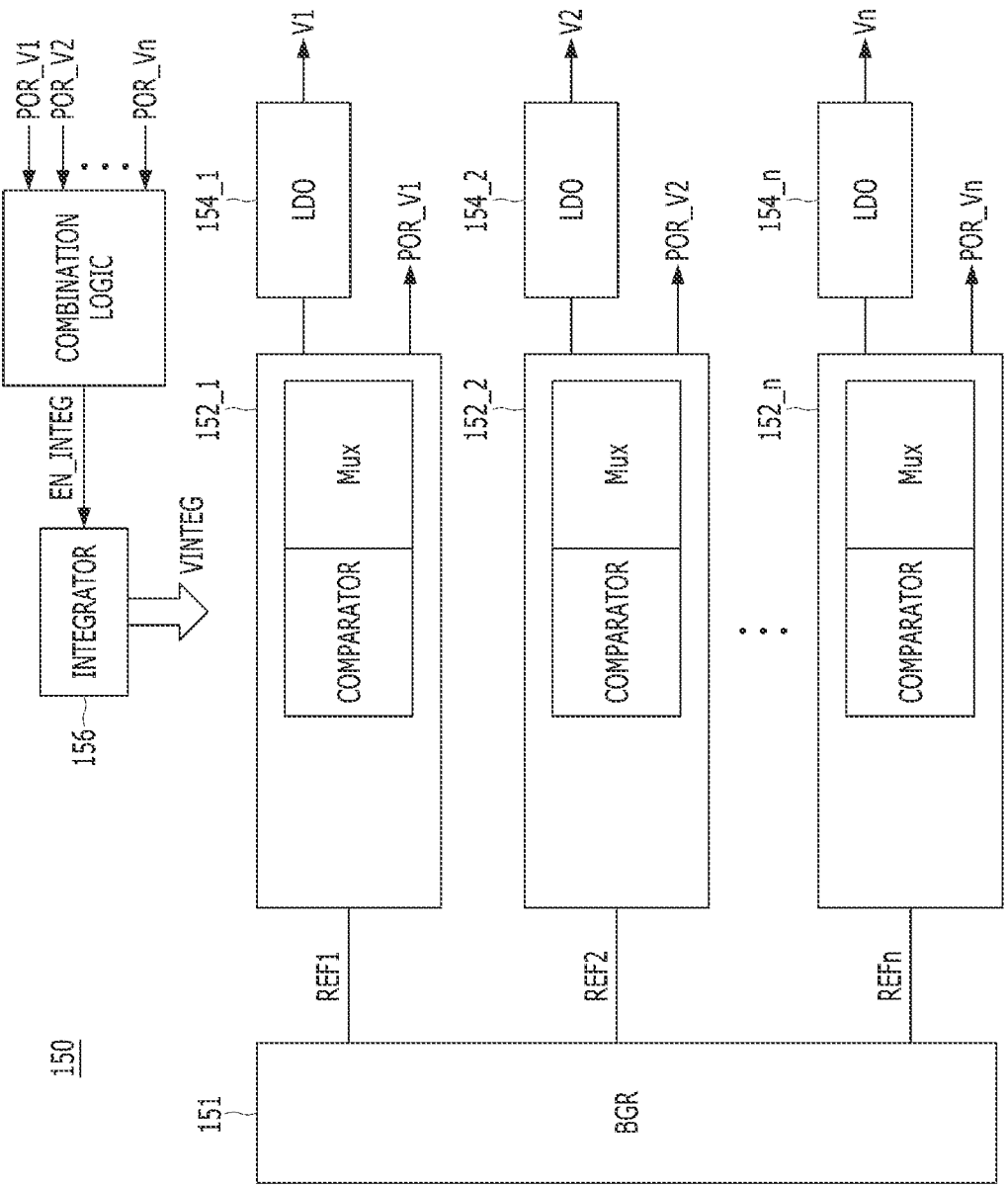
FIG. 10 illustrates an embodiment of a power circuit.

The increasement voltage VINTEG can be output from the integrator 322 based on which one is turned off (e.g., becomes a voltage level of 0V) the latest among the first comparison result POR_VCCI and the second comparison result POR_VCCD output from the first and second comparators 326A and 326E in each of the first in-rush current controller 320A and the second in-rush current controller 320B. Accordingly, the first internal power voltage VCCI and the second internal power voltage VCCD can be gradually increased up to a preset level, so that the in-rush current could be suppressed during an initial section after the external power voltage VCCE is supplied, FIG. 10 illustrates an embodiment of a power circuit 150, which can include a plurality of voltage regulators (LDD) 154_1, 154_2, . . . , 154_$n$. The voltage regulators 154_1, 154_2, . . . , 154_$n$ can individually output a plurality of internal power voltages V1, V2, . . . , Vn. The power circuit 150 can include a bandgap reference circuit (BGR) 151 configured to generate a plurality of reference voltages REF1, REF2, . . . , REFn and a plurality of in-rush current controllers 152_1, 152_2, . . . , 152_$n$ disposed and arranged between the bandgap reference circuit 151 and the voltage regulators 154_1, 154_2, . . . , 154_$n$.

Each of the in-rush current controllers 152_1, 152_2, . . . , 152_n can include a comparator and a multiplexer. The comparison results POR_V1, POR_V2, . . . , POR_Vn output from each comparator in each of the in-rush current controllers 152_1, 152_2, . . . , 152_n can be transmitted to the integrator 156 through a first logic circuit 158. Similar to the power circuit 130 described in FIG. 7, each of the in-rush current controllers 152_1, 152_2, . . . , 152_n in the power circuit 150 does not include an integrator, but the power circuit 150 can include a single integrator 156.

An increasement voltage VINTEG generated by the integrator 156 can be input to the in-rush current controllers 152_1, 152_2, . . . , 152_n. In addition, the comparison results POR_V1, POR_V2, . . . , POR_Vn output from the in-rush current controllers 152_1, 152_2, . . . , 152_n can be input to the first logic circuit 158. The first logic circuit 158 can output an integrator control signal EN_INTEG corresponding to a signal that is turned off the latest among the comparison results POR_V1, POR_V2, . . . , POR_Vn. For example, when a second comparison result POR_V2 is turned off (e.g., become 0V) the latest among the comparison results POR_V1, POR_V2, . . . , POR_Vn, the integrator control signal EN_INTEG corresponding to the second comparison result POR_V2 can be input to the integrator 156. Here, the timing when a single one is turned off the latest among the comparison results POR_V1, POR_V2, . . . , POR_Vn can indicate that the internal power voltages V1, V2, . . . , Vn corresponding to the comparison results POR_V1, POR_V2, . . . , POR_Vn all reach at least one target level, According to an embodiment, the first logic circuit 158 can perform a logical (e.g., OR) operation on a plurality of input signals to generate an output signal, Operations of the integrator 156 and the comparators and multiplexers in the plurality of in-rush current controllers 152_1, 152_2, . . . , 152_n can be understood with reference to FIGS. 2 and 3.

The power circuit 150 described in FIG. 7 can include the in-rush current controllers 152_1, 152_2, . . . , 152_n corresponding to a plurality of voltage regulators 154_1, 154_2, . . . , 154_n configured to output the internal power voltages V1, V2, . . . , Vn. The in-rush current controllers 152_1, 152_2, . . . , 152_n can suppress an amount of the in-rush current occurring until the internal power voltages V1, V2, . . . , Vn reach a preset target level. The times it takes for the internal power voltages V1, V2, . . . , Vn generated by the voltage regulators 154_1, 154_2, . . . , 154_n to reach the preset target level after the external power voltage VCCE is supplied can be different from each other. However, the in-rush current controllers 152_1, 152_2, . . . , 152_n corresponding to the voltage regulators 154_1, 154_2, . . . , 154_n, can use a comparison result which is turned off the latest among the comparison results POR_V1, POR_V2, . . . , POR_Vn regarding each of the internal power voltages V1, V2, . . . , Vn to suppress an amount of the in-rush current. The in-rush current can be suppressed in response to the internal power voltage that reaches the target level the latest. Accordingly, the case where the in-rush current causes damage to an internal component can be avoided. Also, a delay occurring when a level of the internal power voltage reaches the preset target level could be reduced.

Figure 11:
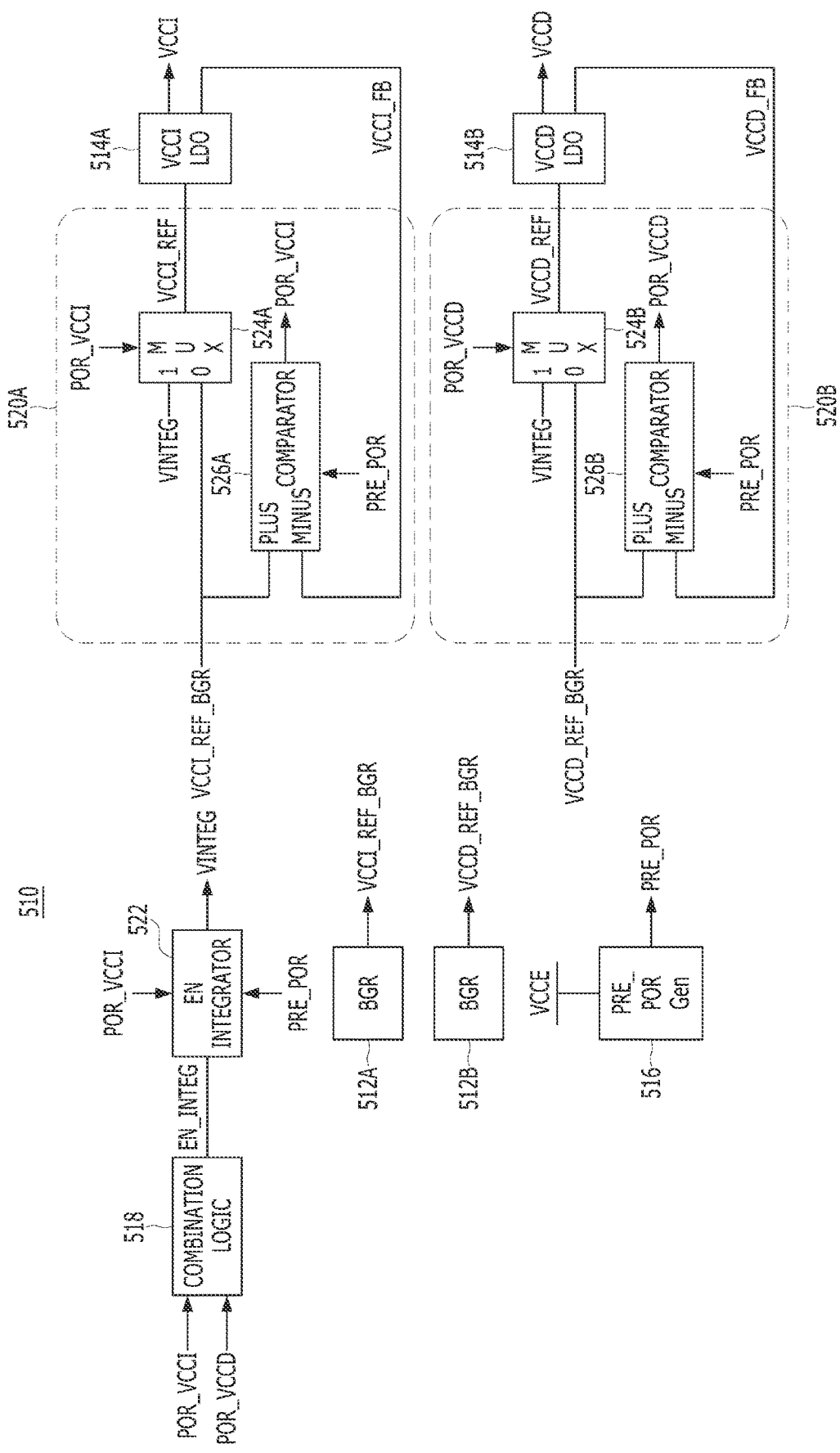
FIG. 11 illustrates an embodiment of a power circuit.
Figure 12:
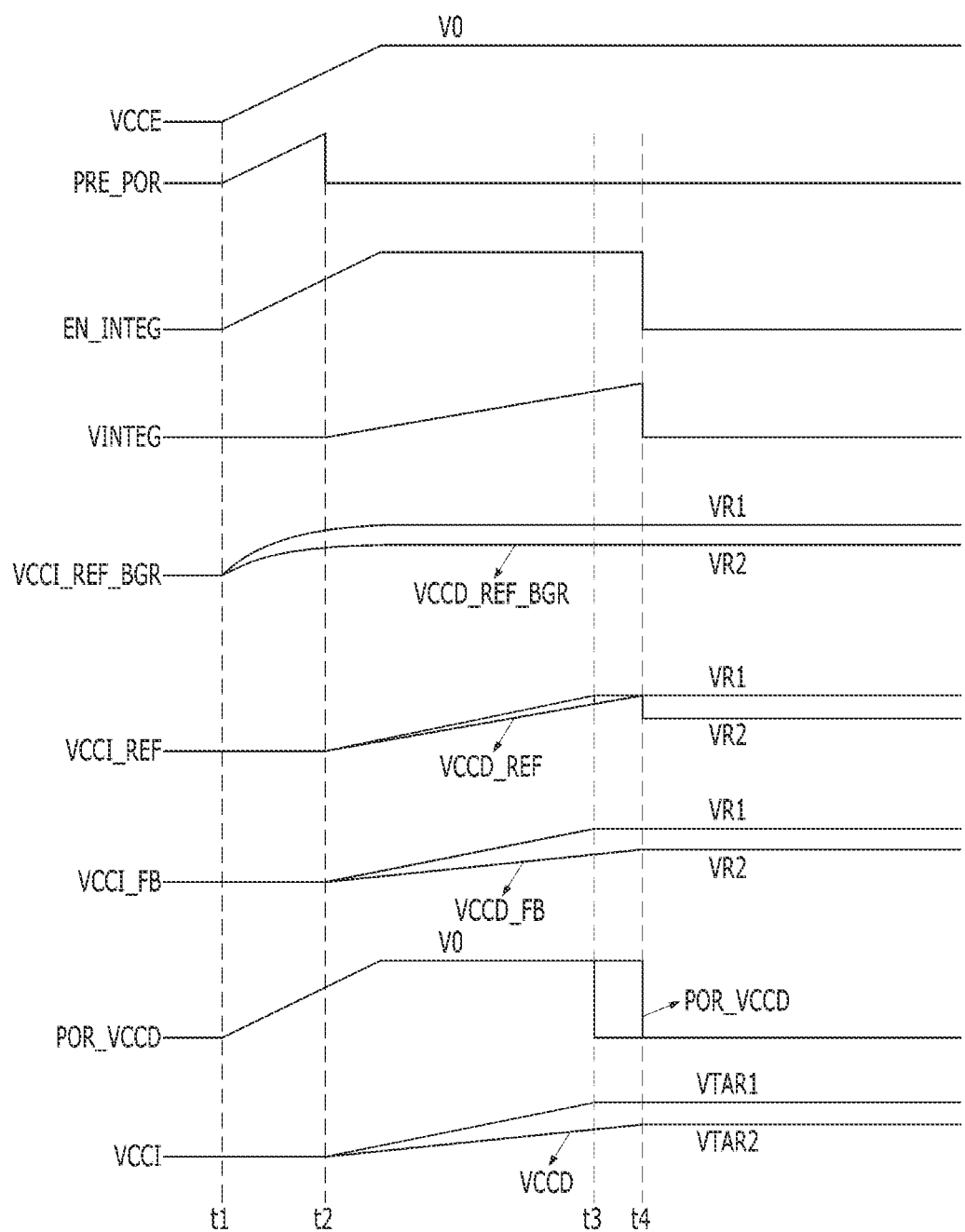
FIG. 12 illustrates an example of a timing diagram corresponding to operation of the power circuit shown in FIG. 11.

FIG. 11 illustrates an embodiment of a power circuit 510, and FIG. 12 illustrates an example of a timing diagram describing operation of the power circuit shown in FIG. 11.

Referring to FIGS. 11 and 12, power circuit 510 can include a plurality of bandgap reference circuits 512A, 512B, a plurality of voltage regulators 514A, 514B, an internal power output controller 516, and a plurality of in-rush current controllers 520A, 520B. The voltage regulators 514A, 514B can output a plurality of internal power voltages VCCI, VCCD. Each of the in-rush current controllers 520A, 520B can include a multiplexer 524A, 524B and a comparator 526A, 426B. The power circuit 510 can include an integrator 522 configured to output an increasement voltage VINTEG to the in-rush current controllers 520A, 520B. The bandgap reference circuits 512A, 512B and the voltage regulators 514A, 514E in the power circuit 510 described with reference to FIG. 11 can correspond, for example, to the bandgap reference circuit 112 and the voltage regulator 114 in the power circuit 110 described with reference to FIG. 1. The power circuit 510 can further include the in-rush current controllers 520A, 520E arranged and disposed between the bandgap reference circuits 512A, 512B and the voltage regulators 514A, 514B.

The internal power output controller 516 in the power circuit 510 can output a power output enable signal PRE_POR when the external power voltage VCCE is supplied. The power output enable signal PRE_POR can enable the power circuit 510 to generate the plurality of internal power voltages VCCI, VCCD from the second timing t2 when a predetermined time passes after the external power voltage VCCE is supplied at the first timing t1. If the plurality of internal power voltages VCCI, VCCD are output without any limitation after the external power voltage VCCE is supplied, levels of the internal power voltages VCCI, VCCD can fluctuate according to changes in the external power voltage VCCE. Fluctuating internal power voltages may, in turn, cause damage to circuits, modules, devices, etc., in the component 120 described with reference to FIG. 1.

In order to overcome this issue, the power output enable signal PRE_POR could disable the power circuit 310 to generate the internal power voltages VCCI, VCCD until the level of the external power voltage VCCE reaches a preset level. For example, the power output enable signal PRE_POR output from the internal power output controller 516 can be input the comparators 526A, 526B and the integrator 522 in each of the in-rush current controllers 520A, 520B.

The integrator 522 in the power circuit 510 can generate the increasement voltage VINTEG based on the first comparison result POR_VCCI output from the first comparator 526A or the second comparison result POR_VCCD output from the second comparator 526B. The first comparison result POR_VCCI output from the first comparator 526A and the second comparison result POR_VCCD output from the second comparator 526B are input to a second logic circuit 528. The second logic circuit 528 can generate an integrator control signal EN_INTEG corresponding to a comparison result that is turned off later among the first comparison result POR_VCCI and the second comparison result POR_VCCD. The integrator control signal EN_INTEG can be input to the integrator 522 for controlling generation of the increasement voltage VINTEG.

Referring to FIG. 12, the first comparison result POR_VCCI may be turned off at the third timing t3, and the second comparison result POR_VCCD may be turned off at the fourth timing t4. In this case, the integrator control signal EN_INTEG corresponding to the second comparison result POR_VCCD may be input to the integrator 322 until the fourth timing t4, so that the integrator 322 could output increasement voltage VINTEG until the fourth timing t4.

The integrator 522 could gradually increase the level of the increasement voltage VINTEG according to a preset rising rate. When the first internal power voltage VCCI or the second internal power voltage VCCD is generated in response to the increasement voltage VINTEG output from the integrator 522, the level of the internal power voltage VCCI or the second internal power voltage VCCD can also increase according to the preset rising speed set for the integrator 522. After the external power voltage VCCE is supplied, the level of the first internal power voltage VCCI or the second internal power voltage VCCD could be prevented from rapidly increasing.

Referring to FIG. 12, the integrator 522 can start to increase the level of the increasement voltage VINTEG in response to the power output enable signal PRE_POR from the second timing t2, The integrator 522 could no longer increase the level of the increasement voltage VINTEG at the fourth timing t4 in response to the second comparison result POR_VCCD output from the second comparator 526B.

The first comparator 526A in the first in-rush current controller 520A can compare a first bandgap reference voltage VCCI_REF_BGR having a preset voltage level VR1 output from the first bandgap reference circuit 512A with a first feedback internal power voltage VCCI_FB having the same level of the first internal power voltage VCCI output from the first voltage regulator 514A, to generate the first comparison result POR_VCCI, The first comparator 526A can output the first comparison result POR_VCCI in response to the power output enable signal PRE_POR output from the internal power output controller 516. For example, immediately after the external power voltage VCCE is supplied, the level of the external power voltage VCCE can be increasing, and the first bandgap reference voltage VCCI_REF_BGR output from the first bandgap reference circuit 512A might not be constant. At this time, the first comparison result POR_VCCI output from the first comparator 526A may not be accurate. Accordingly, the first comparator 526A can output the first comparison result POR_VCCI in response to the power output enable signal PRE_POR from the second timing t2 when a predetermined time elapses after the external power voltage VCCE is supplied at the first timing t1.

Referring to FIG. 12, the first comparator 526A can output the first comparison result POR_VCCI having a voltage level V0 corresponding to the level of the external power voltage VCCE until the third timing t3, When the first internal power voltage VCCI reaches a target voltage level VTAR1 at the third timing t3, the first comparison result POR_VCCI becoming 0V (e.g., turned off) can be output.

The second comparator 526B in the second in-rush current controller 520B can operate substantially the same as the first comparator 526A in the first in-rush current controller 520A. The second comparator 526B can compare a second bandgap reference voltage VCCD_REF_BGR having a preset voltage level VR2 output from the second bandgap reference circuit 512B with a second feedback internal power voltage VCCD_FB having the same level as the second internal power voltage VCCD output from the second voltage regulator 514B, to generate the second comparison result POR_VCCD.

Referring to FIG. 12, the second comparator 526B can output the second comparison result POR_VCCD having a voltage level V0 corresponding to the level of the external power voltage VCCE until the fourth timing t4, When the second internal power voltage VCCD reaches a target voltage level VTAR2 at the fourth timing t4, the second comparison result POR_VCCD becoming 0V can be output.

Referring to FIG. 12, when the external power voltage VCCE starts to be supplied at the first timing t1, the level of the external power voltage VCCE can rise from 0V to a first level V0, and then the external power voltage VCCE could be maintained to have the first level V0. The internal power output controller 516 can generate the power output enable signal PRE_POR having a level which increases according to the increase in the level of the external power voltage VCCE from the first timing t1 when the external power voltage VCCE is supplied to the second timing t2, after a preset time has elapsed from the first timing t1. According to the power output enable signal PRE_POR, the integrator 522 can output the increasement voltage VINTEG after the second timing t2. Further, the first and second comparators 526A, 526B might not output the first and second comparison results POR_VCCI, POR_VCCD until the second timing t2, in response to the power output enable signal PRE_POR.

The first and second comparison results POR_VCCI, POR_VCCD output from the first and second comparators 526A, 5268 can be input to the first and second multiplexers 524A, 524B, The first and second multiplexers 524A, 524B can select one of the increasement voltage VINTEG output to the integrator 522 and the first and second bandgap reference voltages VCCI_REF_BGR, VCCD_REF_BGR output from the first and second bandgap reference circuits 512A, 512B, in response to the first and second comparison results POR_VCCI, POR_VCCD, to output a selected one as the first and second reference internal voltages VCCI_REF, VCCD_REF. The first and second voltage regulators 514A, 5148 can receive the first and second reference internal voltages VCCI_REF, VCCD_REF output from the first and second multiplexers 524A, 5248 in the first and second in-rush current controllers 520A, 520B, adjust the level of the first and second reference internal voltages VCCI_REF, VCCD_REF by a preset multiple (e.g., 1×, 1.2×, 1.5×, 2×, etc.), and generate the first and second internal power voltages VCCI, VCCD having an adjusted level.

According to an embodiment, the first and second feedback internal power voltages VCCI_FB, VCCD_FB transferred from the first and second voltage regulators 514A, 514B to the first and second in-rush current controllers 520A and 520B could be determined by adjusting the levels of the first and second internal power voltages VCCI, VCCD by a certain value. The certain value may correspond to the preset multiple used for generating the first and second internal power voltages VCCI, VCCD. For example, when the first voltage regulator 514A generates the first internal power voltage VCCI having a level that is one times the level of the first reference internal voltage VCCI_REF, the level of the first feedback internal power voltage VCCI_FB could be one times the level of the first internal power voltage VCCI. When the second voltage regulator 514B generates the second internal power voltage VCCD having a level that is twice the level of the second reference internal voltage VCCD_REF, the level of the second feedback internal power voltage VCCD_FB can be ½ times the level of the internal power voltage VCCD.

The first and second reference internal voltages VCCI_REF, VCCD_REF input to the first and second voltage regulators 514A, 514B can be determined as one of the increasement voltage VINTEG (whose levels are gradually increased at a preset rate) and the first and second bandgap reference voltages VCCI_REF_BGR, VCCD_REF_BGR that have a constant level despite changes in the operating environment. Accordingly, because the first and second voltage regulators 514A, 514B operate to generate the first and second internal power voltages VCCI, VCCD based on the increasement voltage VINTEG and the first and second bandgap reference voltages VCC- D_REF_BGR, VCCD_REF_BGR, the amount of the in-rush current that may occur after the external power voltage VCCE is supplied could be suppressed.

Referring to FIG. 12, after the external power voltage VCCE is supplied at the first timing t1, the first bandgap reference voltage VCCI_REF_BGR output from the first bandgap reference circuit 512A can increase from 0V to a stable level of VR1. Then, the stable level VR1 of the first bandgap reference voltage VCCI_REF_BGR could be maintained after the first bandgap reference voltage VCCI_REF_BGR reaches to the stable level VR1. Further, the level of the second bandgap reference voltage VCCD_REF_BGR output from the second bandgap reference circuit 412B could be maintained after rising from 0V to a stable level VR2. However, the levels of the first and second internal power voltages VCCI, VCCD start to rise at the second timing t2 based on the power output enable signal PRE_POR.

According to an embodiment, the first and second comparators 526A, 526B do not perform a comparison operation until the second timing t2, and the first and second comparison results POR_VCCI, POR_VCCD could be output corresponding to the level of the external power voltage VCCE until the second timing t2.

At a second timing t2, the levels of the first and second bandgap reference voltages VCCI_REF_BGR, VCCD_REF_BGR output from the first and second bandgap reference circuits 512A, 512B can be greater than the levels of the first and second feedback internal power voltages VCCI_FB, VCCD_FB. The first and second comparators 526A, 526B can individually output the first and second comparison results POR_VCCI, POR_VCCD corresponding to the level of the external power voltage VCCE.

At a third timing t3 when the first internal power voltage VCCI reaches a preset level, the first comparison result POR_VCCI output from the first comparator 526A can be inverted. At the third timing t3, the level of the first bandgap reference voltage VCCI_REF_BGR can be equal to that of the first feedback internal power voltage VCCI_FB, so that the first comparison result POR_VCCI becomes 0V. Although the first comparison result POR_VCCI is inverted at the third timing t3, the second logic circuit 518 can still output the integrator control signal EN_INTEG in response to the second comparison result POR_VCCD. In response to the integrator control signal EN_INTEG, the integrator 522 can output the increasement voltage VINTEG.

After the third timing t3, the first voltage regulator 514B might generate the second internal power voltage VCCI based on the first bandgap reference voltage VCCI_REF_BGR output from the first bandgap reference circuit 512A. However, because the first comparison result POR_VCCD is not turned off until the fourth timing t4, the second voltage regulator 514B can generate the second internal power voltage VCCD based on the increasement voltage VINTEG output from the integrator 522.

At the fourth timing t4 when the second internal power voltage VCCD reaches a preset level, the second comparison result POR_VCCD output from the second comparator 526B can be inverted. At the fourth timing t4, the level of the second bandgap reference voltage VCCD_REF_BGR can be equal to that of the second feedback internal power voltage VCCD_FB, so that the second comparison result POR_VCCD becomes 0V. In response to the second comparison result POR_VCCD that is turned off later than the first comparison result POR_VCCI, the integrator control signal EN_INTEG can be inverted. In response to the integrator control signal EN_INTEG, the integrator 522 can stop outputting the increasement voltage VINTEG.

Before the fourth timing t4, the integrator 522 can output the increasement voltage VINTEG in response to the second comparison result POR_VCCD, and the increasement voltage VINTEG can be output as the second reference internal voltage VCCD_REF. After the fourth timing t4, the second bandgap reference voltage VCCD_REF_BGR having the preset level VR2 corresponding to the second comparison result POR_VCCD can be output as the second reference internal voltage VCCD_REF.

The fourth timing t4 when the second internal power voltage VCCD output from the second voltage regulator 514B reaches a preset level can be different from the third timing t3 when the first internal power voltage VCCI output from the first voltage regulator 514A reaches a preset level. This may be because preset target levels of the first internal power voltage VCCI and the second internal power voltage VCCD output from the power circuit 510 are different from each other. In addition, the time difference between the third timing t3 and the fourth timing t4 may occur due to changes (e.g., a PVT change) in the design, manufacture, and/or operating environment regarding the bandgap reference circuits 512A, 512B, the voltage regulators 514A, 514B, and the inrush current controllers 520A, 520B in the power circuit 510. This time difference may be recognized through the first comparison result POR_VCCI and the second comparison result POR_VCCD output from the first comparator 526A and the second comparator 526B. The first in-rush current controller 520A and the second in-rush current controller 520B can generate the integrator control signal EN_INTEG based on which one of the first comparison result POR_VCCI and the second comparison result POR_VCCD output from the first and second comparators 526A, 526B is turned off later (e.g., becomes a level of 0V). The integrator 522 can output the increasement voltage VINTEG in response to the integrator control signal EN_INTEG. Accordingly, the first internal power voltage VCCI and the second internal power voltage VCCD can gradually increase to a preset voltage level, so that the in-rush current could be suppressed during an initial section.

In accordance with the aforementioned embodiments, a semiconductor device is provided which can avoid damage of internal components due to an in-rush current occurring in the semiconductor device, having power is supplied by a plurality of power circuits, and which can control the amount of in-rush current so that a power voltage supplied by each of the power circuits can reach a preset target level.

Additionally, a semiconductor device is provided which can supply internal power to perform a stable operation even in an operating environment in which supplied power is unstable.

In some reference current generators, operational characteristics at plural temperatures are checked, compensation values at the plural temperatures are determined, and the compensation values are used as is, for compensating for the change of temperature. However, according to an embodiment of present disclosure, the three-step adjustment can determine a compensation value for the change in a wide temperature range by monitoring or checking operational characteristics of the reference current generator at several representative sampling temperatures.

Accordingly, in accordance with one or more embodiments, a test for checking or monitoring operational characteristics of the reference current generator at tens or hundreds of different temperatures might be not necessary. Also, in accordance with one or more embodiments, a test time of the reference current generator can be reduced because the test might be not performed at tens or hundreds of different temperatures in an operable temperature range.

As above described, a semiconductor device according to an embodiment of the present disclosure can compensate for the change of temperature in a low power voltage environment.

The semiconductor device according to an embodiment of the present disclosure can support a memory system or a data processing system to perform a stable data input/output operation even though a temperature inside of the memory system or the data processing system is changed or fluctuated.

While the present teachings have been illustrated and described with respect to the specific embodiments, it will be apparent to those skilled in the art in light of the present disclosure that various changes and modifications may be made without departing from the spirit and scope of the disclosure as defined in the following claims. Furthermore, the embodiments may be combined to form additional embodiments.

What is claimed is:

1. A power circuit comprising:
   a plurality of regulators coupled to an external power voltage and configured to adjust a level of an input voltage to generate a plurality of internal power voltages, wherein timings when the plurality of internal power voltages generated by the plurality of regulators reach the target level are different; and
   a plurality of in-rush current controllers configured to provide the input voltage to the plurality of regulators, the input voltage corresponding to an increasement voltage, the increasement voltage having a level rising at a preset rate until the plurality of internal power voltages all reach a target level.

2. The power circuit according to claim 1,
   further comprising a bandgap reference circuit configured to output a reference voltage having a constant level when the external power voltage is supplied,
   wherein each of the plurality of in-rush current controllers is arranged between the bandgap reference circuit and the plurality of regulators and is configured to provide, as the input voltage, either the reference voltage at a second time period or the increasement voltage at a first time period to the plurality of regulators, the second time period after the first time period.

3. The power circuit according to claim 2, wherein the plurality of regulators is configured to:
   generate the plurality of internal power voltages based on the increasement voltage at the first time period until the plurality of internal power voltages reach the target level after the external power voltage is supplied; and
   generate the plurality of internal power voltages based on the reference voltage at the second time period after the plurality of internal power voltages reach the target level.

4. The power circuit according to claim 2, wherein each of the plurality of in-rush current controllers comprises:
   a comparator configured to compare the reference voltage with an internal power voltage output from a corresponding regulator among the plurality of regulators and to output a comparison result; and
   a multiplexer configured to select and output one of the reference voltage and the increasement voltage based on the comparison result.

5. The power circuit according to claim 4, further comprising at least one integrator configured to output the increasement voltage when a first time elapses after the external power voltage is supplied.

6. The power circuit according to claim 5, further comprising a combination logic configured to receive the comparison result output from the comparator included in each of the plurality of in-rush current controllers and output, to the at least one integrator, a timing when the plurality of internal power voltages reach the target level the latest.

7. The power circuit according to claim 4,
   wherein the increasement voltage has a same or lesser level than the reference voltage, and
   wherein a level of the increasement voltage is increased during a second time, which is longer than the first time, according to a preset speed from a ground voltage to the constant level of the reference voltage.

8. The power circuit according to claim 1,
   wherein each of the plurality of regulators generates respective ones of the plurality of internal power voltages, and
   wherein the plurality of internal power voltages reach at least two different target levels.

9. A semiconductor device comprising:
   a data device configured to store a data entry or process and modify the data entry; and
   a power circuit configured to supply a plurality of internal power voltages to the data device based on an external power voltage input through a pin or a pad,
   wherein the power circuit comprises a plurality of in-rush current controllers configured to provide an increasement voltage having a level rising at a preset rate, instead of a reference voltage having a constant level, until a timing when the plurality of internal power voltages reach a target level the latest,
   wherein the power circuit further comprises:
   a bandgap reference circuit configured to output the reference voltage having a constant level even when an operation condition changes; and
   a plurality of regulators coupled to the external power voltage and configured to adjust a level of the reference voltage or the increasement voltage to generate the plurality of internal power voltages, wherein timings when the plurality of internal power voltages generated by the plurality of regulators reach the target level are different.

10. The semiconductor device according to claim 9, wherein the plurality of in-rush current controllers is arranged between the bandgap reference circuit and the plurality of regulators.

11. The semiconductor device according to claim 10, wherein the plurality of in-rush current controllers provide a selected one of the reference voltage and the increasement voltage to the plurality of regulators based on different timings.

12. The semiconductor device according to claim 9, wherein the plurality of regulators is configured to:
   generate the plurality of internal power voltages based on the increasement voltage until the plurality of internal power voltages reach the target level after the external power voltage is supplied; and
   generate the plurality of internal power voltages based on the reference voltage after the plurality of internal power voltages reach the target level.

13. The semiconductor device according to claim 12,
   wherein each of the plurality of regulators adjusts a level of the reference voltage or the increasement voltage to generate each of the plurality of internal power voltages, and wherein the plurality of internal power voltages reach at least two different target levels.

14. The semiconductor device according to claim 9, wherein each of the plurality of in-rush current controllers comprises:
- a comparator configured to compare the reference voltage with an internal power voltage output from a corresponding regulator among the plurality of regulators, to output a comparison result; and
- a multiplexer configured to select and output one of the reference voltage and the increasement voltage based on the comparison result.

15. The semiconductor device according to claim 14, wherein the power circuit further comprises at least one integrator configured to output the increasement voltage when a first time elapses after the external power voltage is supplied.

16. The semiconductor device according to claim 15, wherein the power circuit further comprises a combination logic configured to receive the comparison result output from the comparator included in each of the plurality of in-rush current controllers and output, to the at least one integrator, a timing when the plurality of internal power voltages reach the target level the latest.

17. The semiconductor device according to claim 14,
- wherein the increasement voltage has a same or lesser level than the reference voltage, and
- wherein a level of the increasement voltage is increased during a second time, which is longer than the first time, according to a preset speed from a ground voltage to the constant level of the reference voltage.

* * * * *